United States Patent
Wang et al.

(10) Patent No.: US 11,728,454 B1
(45) Date of Patent: Aug. 15, 2023

(54) METHOD FOR SOLDERING SOLAR CELL, CELL STRING, PHOTOVOLTAIC MODULE, AND SOLDERING DEVICE

(71) Applicant: Solarlab Aiko Europe GmbH, Freiburg (DE)

(72) Inventors: Yongqian Wang, Yiwu (CN); Ning Zhang, Yiwu (CN); Wenli Xu, Yiwu (CN); Gang Wang, Yiwu (CN); Gang Chen, Yiwu (CN)

(73) Assignee: SOLARLAB AIKO EUROPE GMBH, Freiburg (DE)

( * ) Notice: Subject to any disclaimer, the term of this patent is extended or adjusted under 35 U.S.C. 154(b) by 0 days.

(21) Appl. No.: 17/845,962

(22) Filed: Jun. 21, 2022

(30) Foreign Application Priority Data

Mar. 3, 2022 (CN) .......................... 202210201738.9

(51) Int. Cl.
*H01L 31/18* (2006.01)
*H01L 31/0224* (2006.01)
*H01L 31/05* (2014.01)

(52) U.S. Cl.
CPC .... *H01L 31/186* (2013.01); *H01L 31/022425* (2013.01); *H01L 31/05* (2013.01)

(58) Field of Classification Search
CPC ......... H01L 31/022441; H01L 31/0504; H01L 31/0508; H01L 31/0516; H01L 31/0682; H01L 31/18; H01L 31/188; B41F 15/08; B41F 15/0818; B41F 15/14; B41F 15/34; B41F 15/40; B41F 15/42; B23K 2101/40
See application file for complete search history.

(56) References Cited

U.S. PATENT DOCUMENTS

| | | | | |
|---|---|---|---|---|
| 10,335,882 B2 * | 7/2019 | Hwang | | H01L 31/05 |
| 2016/0380120 A1 * | 12/2016 | Terao | | H01L 31/0504 |
| | | | | 136/244 |
| 2017/0141252 A1 * | 5/2017 | Oh | | H01L 31/0508 |

FOREIGN PATENT DOCUMENTS

| | | |
|---|---|---|
| CN | 104995746 A | 10/2015 |
| CN | 106826011 A | 6/2017 |
| CN | 110695580 A | 1/2020 |
| CN | 111192940 A | 5/2020 |
| CN | 111403529 A | 7/2020 |
| CN | 111785804 A | 10/2020 |
| WO | 9617387 A1 | 6/1996 |
| WO | 2019159255 A1 | 8/2019 |

* cited by examiner

*Primary Examiner* — Mayla Gonzalez Ramos
(74) *Attorney, Agent, or Firm* — Matthias Scholl P.C.; Scholl Matthias

(57) ABSTRACT

A method for soldering a solar cell, includes: placing a plurality of back contact cells on a soldering platform, where back surfaces of the back contact cells face away from the soldering platform, and electrodes corresponding to two adjacent back contact cells have opposite polarities in a connection direction of a plurality of to-be-connected ribbons; placing the plurality of to-be-connected ribbons on the electrodes of the plurality of back contact cells by using a first clamping portion, a second clamping portion, and a plurality of third clamping portions, where the first clamping portion, the second clamping portion, and the plurality of third clamping portions respectively correspond to head ends, tail ends, and middle portions of the plurality of ribbons; and heating the plurality of ribbons by using a heater to connect the plurality of ribbons to the plurality of back contact cells.

13 Claims, 12 Drawing Sheets

METHOD FOR SOLDERING SOLAR CELL, CELL STRING, PHOTOVOLTAIC MODULE, AND SOLDERING DEVICE

CROSS-REFERENCE TO RELATED APPLICATIONS

Pursuant to 35 U.S.C. § 119 and the Paris Convention Treaty, this application claims foreign priority to Chinese Patent Application No. 202210201738.9 filed Mar. 3, 2022, the contents of which, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 245 First Street, 18th Floor, Cambridge, Mass. 02142.

BACKGROUND

The disclosure belongs to the field of solar cells, and more particularly, to a method for soldering a solar cell, a cell string, a photovoltaic module, and a soldering device.

A solar cell converts sunlight to electric energy by means of a photovoltaic effect of a semiconductor p-n junction.

Two adjacent solar cells are usually connected to each other by using a ribbon, so as to form a cell string, and then the cell string is packaged into a photovoltaic module. In this way, a service life of the solar cell can be prolonged, and reliability of the solar cell can be enhanced. However, the ribbon cannot be effectively produced and positioned by a conventional series soldering technology, resulting in poor soldering precision, which does not meet a requirement for high-precision soldering of a back contact cell.

SUMMARY

This disclosure provides a method for soldering a solar cell, a cell string, a photovoltaic module, and a soldering device, to improve soldering precision of a back contact cell.

A method for soldering a solar cell in an embodiment of this disclosure comprises:

placing a plurality of back contact cells on a soldering platform, where back surfaces of the back contact cells face away from the soldering platform, and electrodes corresponding to two adjacent back contact cells have opposite polarities in a connection direction of ribbons;

placing the plurality of to-be-connected ribbons on the electrodes of the plurality of back contact cells by using a first clamping portion, a second clamping portion, and third clamping portions, where the first clamping portion, the second clamping portion, and the third clamping portions respectively correspond to head ends, tail ends, and middle portions of the plurality of ribbons; and heating the plurality of ribbons by using a heater to connect the plurality of ribbons to the plurality of back contact cells.

In a class of this embodiment, placing the plurality of to-be-connected ribbons on the electrodes of the plurality of back contact cells comprises:

simultaneously placing the plurality of to-be-connected ribbons on the electrodes of the plurality of back contact cells; and heating the plurality of ribbons by using a heater to connect the plurality of ribbons to the plurality of back contact cells comprises:

simultaneously heating the plurality of ribbons by using the heater to simultaneously connect the plurality of ribbons to the plurality of back contact cells.

In a class of this embodiment, the simultaneously placing the plurality of to-be-connected ribbons on the electrodes of the plurality of back contact cells comprises:

simultaneously placing all of the ribbons required for an entire cell string on the electrodes of the plurality of back contact cells; and simultaneously heating the plurality of ribbons by using the heater to simultaneously connect the plurality of ribbons to the plurality of back contact cells comprises:

simultaneously heating all of the ribbons required for the entire cell string by using the heater, to simultaneously connect all of the ribbons required for the entire cell string to all of the back contact cells.

In a class of this embodiment, the ribbons comprise a plurality of first ribbons and a plurality of second ribbons;

the first clamping portion comprises a plurality of first clamping jaws and a plurality of second clamping jaws, the first clamping jaws and the second clamping jaws are in staggered arrangement, the first clamping jaws are configured to clamp head ends of the first ribbons, and the second clamping jaws are configured to clamp head ends of the second ribbons; and the second clamping portion comprises a plurality of third clamping jaws and a plurality of fourth clamping jaws, the third clamping jaws and the fourth clamping jaws are in staggered arrangement, the third clamping jaws are configured to clamp tail ends of the first ribbons, and the fourth clamping jaws are configured to clamp tail ends of the second ribbons.

In a class of this embodiment, a gap is formed between each two adjacent back contact cells, a plurality of third clamping portions are arranged, and each third clamping portion corresponds to one gap.

In a class of this embodiment, a distance between two adjacent third clamping portions is greater than a width of the back contact cell.

In a class of this embodiment, the distance between the two adjacent third clamping portions equals a sum of the width of the back contact cell and a width of the gap.

In a class of this embodiment, a distance between the first clamping portion and the adjacent third clamping portions is greater than a width of the back contact cell.

In a class of this embodiment, the distance between the first clamping portion and the adjacent third clamping portions equals a sum of the width of the back contact cell and a width of the gap.

In a class of this embodiment, a distance between the second clamping portion and the adjacent third clamping portions is greater than a width of the back contact cell.

In a class of this embodiment, the distance between the second clamping portion and the adjacent third clamping portions equals a sum of the width of the back contact cell and a width of the gap.

In a class of this embodiment, the ribbons comprise a plurality of first ribbons and a plurality of second ribbons; one of two adjacent third clamping portions is configured to clamp the first ribbons, and the other of the two adjacent third clamping portions is configured to clamp the second ribbons; and before heating the plurality of ribbons by using the heater to connect the plurality of ribbons to the plurality of back contact cells, the method for soldering a solar cell further comprises:

cutting clamped portions of the plurality of first ribbons and the plurality of second ribbons by using cutting members of the third clamping portions.

In a class of this embodiment, cutting clamped portions of the plurality of first ribbons and the plurality of second ribbons by using cutting members of the third clamping portions comprises:

simultaneously cutting the clamped portions of the plurality of first ribbons and the plurality of second ribbons by using the cutting members.

In a class of this embodiment, simultaneously cutting the clamped portions of the plurality of first ribbons and the plurality of second ribbons by using the cutting members comprises:

simultaneously cutting the clamped portions of all of the first ribbons and all of the second ribbons required for the entire cell string by using the cutting members.

In a class of this embodiment, the ribbons comprise a plurality of first ribbons and a plurality of second ribbons, and the third clamping portions are configured to clamp the first ribbons and the second ribbons; the third clamping portions comprise cutting members, the cutting members of two adjacent third clamping portions respectively correspond to one of the first ribbons and one of the second ribbons, and before heating the plurality of ribbons by using the heater to connect the plurality of ribbons to the plurality of back contact cells, the method for soldering a solar cell further comprises:

cutting clamped portions of the plurality of first ribbons by using the cutting members corresponding to the first ribbons; and cutting clamped portions of the plurality of second ribbons by using the cutting members corresponding to the second ribbons.

In a class of this embodiment, cutting clamped portions of the plurality of first ribbons by using the cutting members corresponding to the first ribbons comprises:

simultaneously cutting the clamped portions of the plurality of first ribbons by using the cutting members corresponding to the first ribbons; and cutting clamped portions of the plurality of second ribbons by using the cutting members corresponding to the second ribbons comprises:

simultaneously cutting the clamped portions of the plurality of second ribbons by using the cutting members corresponding to the second ribbons.

In a class of this embodiment, simultaneously cutting the clamped portions of the plurality of first ribbons by using the cutting members corresponding to the first ribbons comprises:

simultaneously cutting the clamped portions of all of the first ribbons required for the entire cell string by using the cutting members corresponding to the first ribbons; and simultaneously cutting the clamped portions of the plurality of second ribbons by using the cutting members corresponding to the second ribbons comprises:

simultaneously cutting the clamped portions of all of the second ribbons required for the entire cell string by using the cutting members corresponding to the second ribbons.

In a class of this embodiment, transport portions are arranged among the first clamping portion, the second clamping portion, and the third clamping portions, and before placing the plurality of to-be-connected ribbons on the electrodes of the plurality of back contact cells by using the first clamping portion, the second clamping portion, and the third clamping portions, the method for soldering a solar cell further comprises:

moving a plurality of pressing tools from initial positions to lifted positions by using the transport portions; and grabbing the plurality of ribbons by using the first clamping portion, the second clamping portion, and the third clamping portions; and after placing the plurality of to-be-connected ribbons on the electrodes of the plurality of back contact cells by using the first clamping portion, the second clamping portion, and the third clamping portions, the method for soldering a solar cell further comprises:

moving the plurality of pressing tools from the lifted positions to pressed positions by using the transport portions, to cause the pressing tools to press the back contact cells on which the ribbons are placed.

In a class of this embodiment, moving a plurality of pressing tools from initial positions to lifted positions by using the transport portions comprises:

simultaneously moving the plurality of pressing tools from the initial positions to the lifted positions by using the transport portions;

grabbing the plurality of ribbons by using the first clamping portion, the second clamping portion, and the third clamping portions comprises:

simultaneously grabbing the plurality of ribbons by using the first clamping portion, the second clamping portion, and the third clamping portions; and moving the plurality of pressing tools from the lifted positions to pressed positions by using the transport portions, to cause the pressing tools to press the back contact cells on which the ribbons are placed comprises:

simultaneously moving the plurality of pressing tools from the lifted positions to the pressed positions by using the transport portions, to cause the pressing tools to simultaneously press the back contact cells on which the ribbons are placed.

In a class of this embodiment, simultaneously moving the plurality of pressing tools from the initial positions to the lifted positions by using the transport portions comprises:

simultaneously all of the pressing tools required for the entire cell string from the initial positions to the lifted positions by using the transport portions;

simultaneously grabbing the plurality of ribbons by using the first clamping portion, the second clamping portion, and the third clamping portions comprises:

simultaneously grab all of the ribbons required for the entire cell string by using the first clamping portion, the second clamping portion, and the third clamping portions; and simultaneously moving the plurality of pressing tools from the lifted positions to the pressed positions by using the transport portions, to cause the pressing tools to simultaneously press the back contact cells on which the ribbons are placed comprises:

simultaneously moving all of the pressing tools required for the entire cell string from the lifted positions to the pressed positions by using the transport portions, to cause all of the pressing tools required for the entire cell string to simultaneously press the back contact cells on which the ribbons are placed.

A cell string in an embodiment of this disclosure is soldered by using any of the above methods for soldering a solar cell.

A photovoltaic module in an embodiment of this disclosure comprises the above cell string.

A soldering device in an embodiment of this disclosure comprises a soldering platform, a first clamping portion, a second clamping portion, third clamping portions, and a heater, where the soldering platform is configured to carry a plurality of back contact cells, back surfaces of the back contact cells face away from the soldering platform, and electrodes corresponding to two adjacent back contact cells have opposite polarities in a connection direction of ribbons; the first clamping portion, the second clamping portion, and the third clamping portions respectively correspond to head ends, tail ends, and middle portions of the plurality of ribbons, and are configured to place a plurality of to-be-connected ribbons on the electrodes of the plurality of back contact cells; and the heater is configured to heat the plurality of ribbons to connect the plurality of ribbons to the plurality of back contact cells.

In a class of this embodiment, the first clamping portion, the second clamping portion, and the third clamping portions are configured to simultaneously place the plurality of to-be-connected ribbons on the electrodes of the plurality of back contact cells; and the heater is configured to simultaneously heat the plurality of ribbons to simultaneously connect the plurality of ribbons to the plurality of back contact cells.

In a class of this embodiment, the first clamping portion, the second clamping portion, and the third clamping portions are configured to simultaneously place all of the ribbons required for an entire cell string on the electrodes of the plurality of back contact cells; and the heater is configured to simultaneously heat all of the ribbons required for the entire cell string, to simultaneously connect all of the ribbons required for the entire cell string to all of the back contact cells.

In a class of this embodiment, the ribbons comprise a plurality of first ribbons and a plurality of second ribbons;
the first clamping portion comprises a plurality of first clamping jaws and a plurality of second clamping jaws, the first clamping jaws and the second clamping jaws are in staggered arrangement, the first clamping jaws are configured to clamp head ends of the first ribbons, and the second clamping jaws are configured to clamp head ends of the second ribbons; and
the second clamping portion comprises a plurality of third clamping jaws and a plurality of fourth clamping jaws, the third clamping jaws and the fourth clamping jaws are in staggered arrangement, the third clamping jaws are configured to clamp tail ends of the first ribbons, and the fourth clamping jaws are configured to clamp tail ends of the second ribbons.

In a class of this embodiment, a gap is formed between each two adjacent back contact cells, a plurality of third clamping portions are arranged, and each third clamping portion corresponds to one gap.

In a class of this embodiment, a distance between two adjacent third clamping portions is greater than a width of the back contact cell.

In a class of this embodiment, the distance between the two adjacent third clamping portions equals a sum of the width of the back contact cell and a width of the gap.

In a class of this embodiment, a distance between the first clamping portion and the adjacent third clamping portions is greater than a width of the back contact cell.

In a class of this embodiment, the distance between the first clamping portion and the adjacent third clamping portions equals a sum of the width of the back contact cell and a width of the gap.

In a class of this embodiment, a distance between the second clamping portion and the adjacent third clamping portions is greater than a width of the back contact cell.

In a class of this embodiment, the distance between the second clamping portion and the adjacent third clamping portions equals a sum of the width of the back contact cell and a width of the gap.

In a class of this embodiment, the ribbons comprise a plurality of first ribbons and a plurality of second ribbons; one of two adjacent third clamping portions is configured to clamp the first ribbons, and the other of the two adjacent third clamping portions is configured to clamp the second ribbons; and the third clamping portions comprise cutting members configured to cut clamped portions of the plurality of first ribbons and the plurality of second ribbons.

In a class of this embodiment, the cutting members are configured to simultaneously cut the clamped portions of the plurality of first ribbons and the plurality of second ribbons.

In a class of this embodiment, the cutting members are configured to simultaneously cut the clamped portions of all of the first ribbons and all of the second ribbons required for the entire cell string.

In a class of this embodiment, the ribbons comprise a plurality of first ribbons and a plurality of second ribbons, and the third clamping portions are configured to clamp the first ribbons and the second ribbons; the third clamping portions comprise cutting members, the cutting members of two adjacent third clamping portions respectively correspond to one of the first ribbons and one of the second ribbons, and the cutting members corresponding to the first ribbons are configured to cut clamped portions of the plurality of first ribbons; and the cutting members corresponding to the second ribbons are configured to cut clamped portions of the plurality of second ribbons.

In a class of this embodiment, the cutting members corresponding to the first ribbons are configured to simultaneously cut the clamped portions of the plurality of first ribbons; and the cutting members corresponding to the second ribbons are configured to simultaneously cut the clamped portions of the plurality of second ribbons.

In a class of this embodiment, the cutting members corresponding to the first ribbons are configured to simultaneously cut the clamped portions of all of the first ribbons required for the entire cell string; and the cutting members corresponding to the second ribbons are configured to simultaneously cut the clamped portions of all of the second ribbons required for the entire cell string.

In a class of this embodiment, transport portions are arranged among the first clamping portion, the second clamping portion, and the third clamping portions, and the transport portions are configured to move a plurality of pressing tools from initial positions to lifted positions; the first clamping portion, the second clamping portion, and the third clamping portions are configured to grab the plurality of ribbons; and the transport portions are configured to move the plurality of pressing tools from the lifted positions to pressed positions, to cause the pressing tools to press the back contact cells on which the ribbons are placed.

In a class of this embodiment, the transport portions are configured to simultaneously move the plurality of pressing tools from the initial positions to the lifted positions; the first clamping portion, the second clamping portion, and the third clamping portions are configured to simultaneously grab the plurality of ribbons; and the transport portions are configured to simultaneously move the plurality of pressing tools from the lifted positions to the pressed positions, to cause the pressing tools to simultaneously press the back contact cells on which the ribbons are placed.

In a class of this embodiment, the transport portions are configured to simultaneously move all of the pressing tools required for the entire cell string from the initial positions to the lifted positions; the first clamping portion, the second clamping portion, and the third clamping portions are configured to simultaneously grab all of the ribbons required for the entire cell string; and the transport portions are configured to simultaneously move all of the pressing tools required for the entire cell string from the lifted positions to the pressed positions, to cause all of the pressing tools required for the entire cell string to simultaneously press the back contact cells on which the ribbons are placed.

According to the method for soldering a solar cell, the cell string, the photovoltaic module, and the soldering device in the embodiments of this disclosure, the back surfaces of the back contact cells face upward during soldering, and the plurality of ribbons are simultaneously clamped, transferred, and soldered. Therefore, soldering precision and production efficiency can be improved, and production costs can be reduced. In addition, since the soldering precision is improved, a finger having an opposite polarity can be designed closer to a busbar without resulting in a short circuit. In this way, the finger can collect currents of more areas, thereby facilitating improvement of cell efficiency and module efficiency.

DETAILED DESCRIPTION

Figure 1:
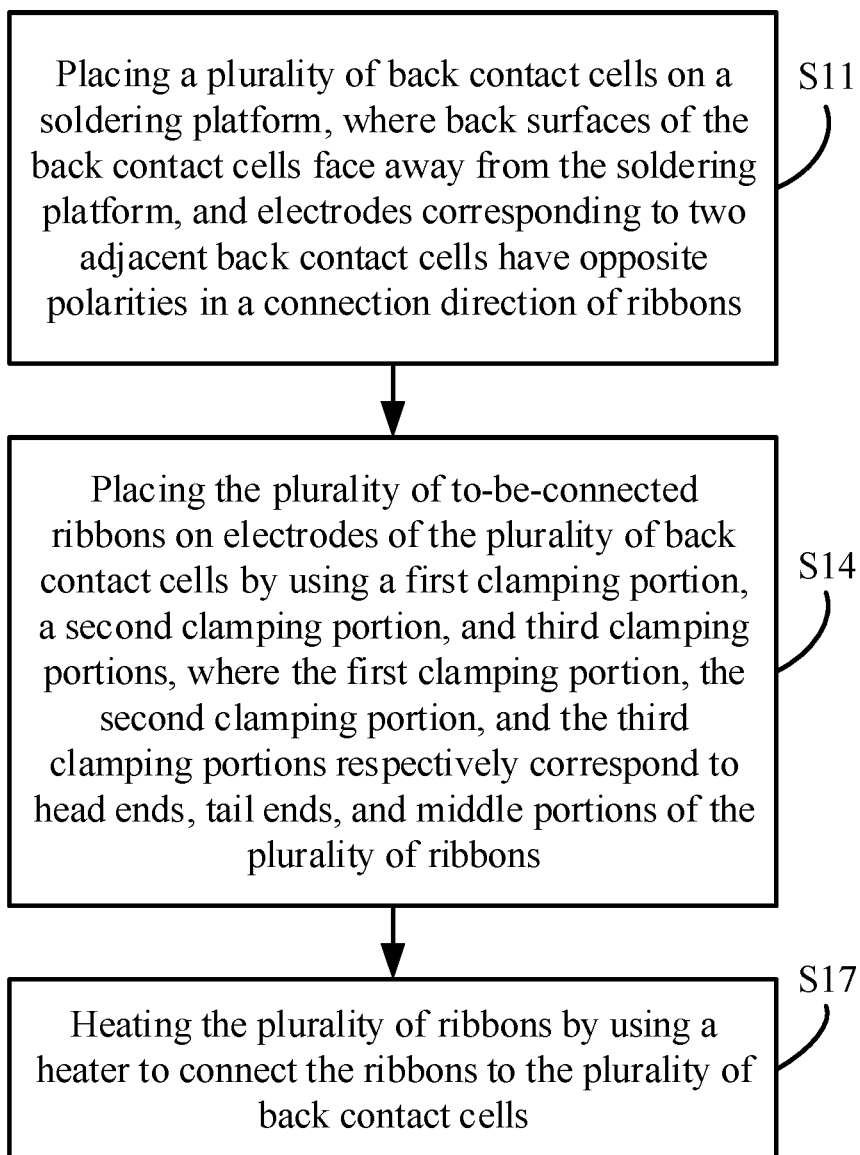
FIG. 1 is a schematic flowchart of a method for soldering a solar cell according to an embodiment of this disclosure.

To make objectives, technical solutions, and advantages of this disclosure clearer and more comprehensible, this disclosure is further described in detail with reference to the accompanying drawings and embodiments. It is to be understood that the specific embodiments described herein are only used for explaining this disclosure, and are not used for limiting this disclosure.

Referring to FIG. 1, FIG. 2, FIG. 3, FIG. 4, FIG. 5, and FIG. 6, a method for soldering a solar cell in an embodiment of this disclosure comprises the following steps:

Step S11: Placing a plurality of back contact cells 20 on a soldering platform 102, where back surfaces of the back contact cells 20 face away from the soldering platform 102, and electrodes corresponding to two adjacent back contact cells 20 have opposite polarities in a connection direction of ribbons 10.

Step S14: Placing the plurality of to-be-connected ribbons 10 on the electrodes of the plurality of back contact cells 20 by using a first clamping portion 31, a second clamping portion 32, and third clamping portions 33, where the first clamping portion 31, the second clamping portion 32, and the third clamping portions 33 respectively correspond to head ends, tail ends, and middle portions of the plurality of ribbons 10.

Step S17: Heating the plurality of ribbons 10 by using a heater 104 to connect the plurality of ribbons 10 to the plurality of back contact cells 20.

According to the method for soldering a solar cell in this embodiment of this disclosure, the back surfaces of the back contact cells 20 face upward during soldering, and the plurality of ribbons 10 are simultaneously clamped, transferred, and soldered. Therefore, soldering precision and production efficiency can be improved, and production costs can be reduced. In addition, since the soldering precision is improved, a finger having an opposite polarity can be designed closer to a busbar without resulting in a short circuit. In this way, the finger can collect currents of more areas, thereby facilitating improvement of cell efficiency and module efficiency.

Specifically, in step S11, the plurality of back contact cells 20 are placed on the soldering platform 102 with the back surfaces facing upward. Therefore, the back surfaces of the back contact cells 20 face away from the soldering platform 102, so that the ribbons 10 can be conveniently placed on the electrodes on the back surfaces of the back contact cells 20.

Specifically, in step S11, the soldering platform 102 may comprise vacuum adsorption holes. After the plurality of back contact cells 20 are placed on the soldering platform 102, the vacuum adsorption holes are revealed to adsorb the plurality of back contact cells 20 on the soldering platform 102. Therefore, positions of the plurality of back contact cells 20 are fixed by means of vacuum adsorption on the soldering platform 102, so that relative movement can be prevented, thereby facilitating improvement of the soldering precision.

Further, after step S17, the vacuum adsorption holes may be covered, and a cell string 100 is taken from the soldering platform 102 by a manipulator.

Further, the cell string 100 may be transported to a cell string typesetting machine from the soldering platform 102. The cell string typesetting machine arranges a plurality of cell strings 100 and then transport the cell strings to a laminating machine to fabricate a photovoltaic module.

Specifically, in step S11, a scratch-proof member may be arranged on a surface of the soldering platform 102 in contact with the back contact cells 20. The scratch-proof member is, for example, a teflon tape or other high temperature resistant smooth materials. In this way, front surfaces of the back contact cells 20 can be prevented from being scratched by the soldering platform 102.

Specifically, in step S11, a temperature of the soldering platform 102 may range from 120° C. to 170° C., for example, 120° C., 125° C., 130° C., 145° C., 150° C., 165° C., or 170° C. The temperature of the soldering platform 102 may be constant, such as a constant value within the range of 120° C. to 170° C. In this way, warpage of the cell string 100 can be reduced.

Figure 4:
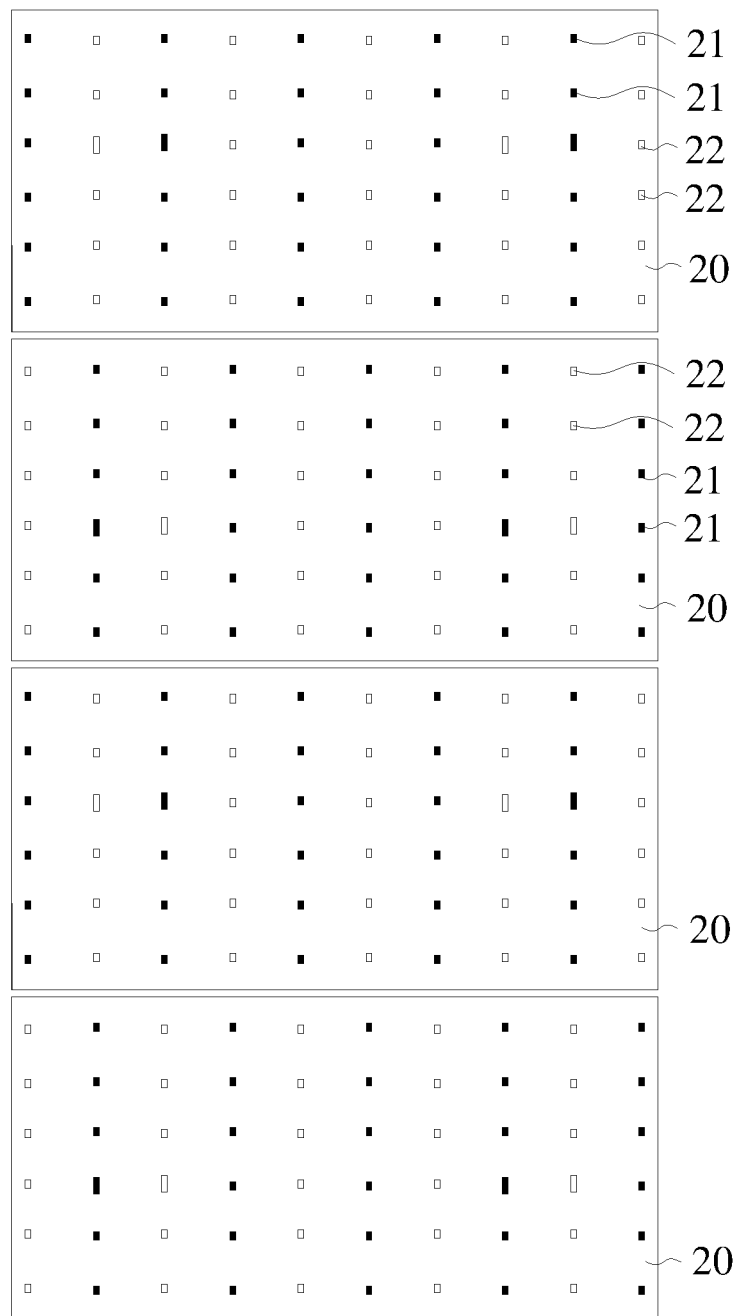
FIG. 4 is a schematic diagram of a scenario of the method for soldering a solar cell according to an embodiment of this disclosure.

Specifically, referring to FIG. 4, in step S11, the plurality of back contact cells 20 may be arranged on the soldering platform 102 by a cell arrangement mechanism with the polarities of the electrodes corresponding to the plurality of back contact cells 20 in the connection direction of the ribbons 10 being opposite. The plurality of arranged back contact cells 20 may be further simultaneously placed on the soldering platform 102.

Specifically, before step S11, the positions of the plurality of back contact cells 20 may be corrected by using the manipulator, and then the plurality of back contact cells 20 may be simultaneously placed on the soldering platform 102. Since the positions are corrected before transfer at one time, positioning precision and the production efficiency can be improved.

Figure 5:
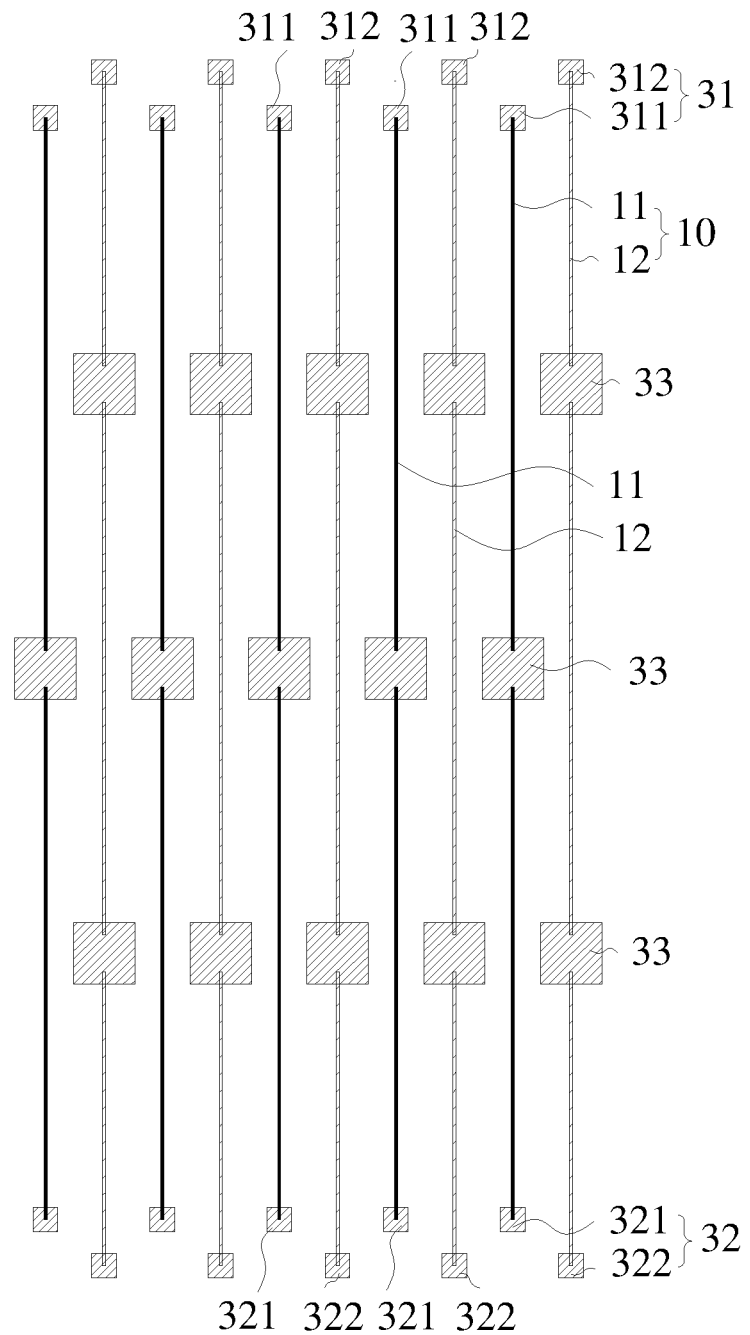
FIG. 5 is a schematic diagram of a scenario of the method for soldering a solar cell according to an embodiment of this disclosure.
Figure 6:
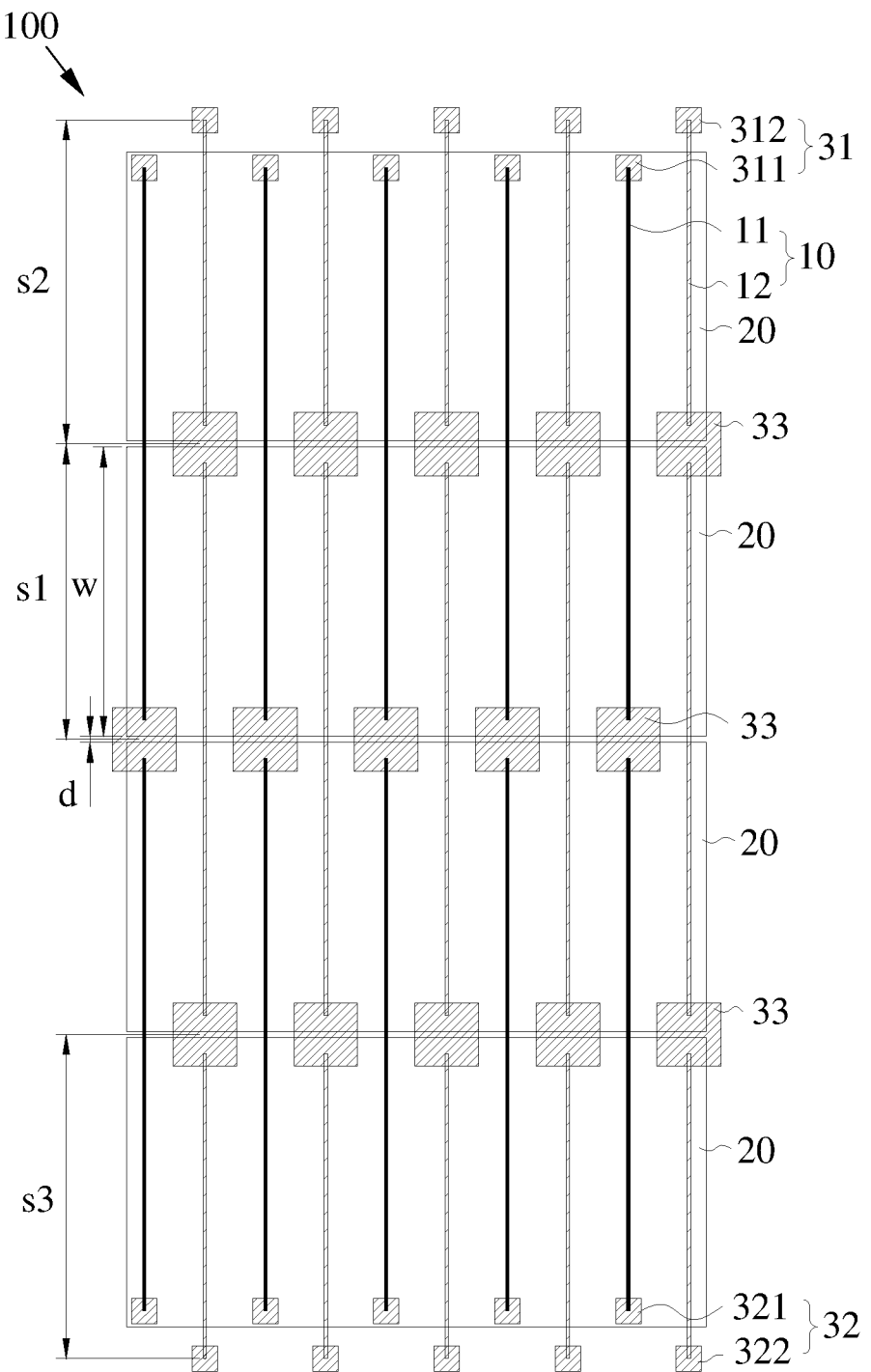
FIG. 6 is a schematic diagram of a scenario of the method for soldering a solar cell according to an embodiment of this disclosure.

Specifically, referring to FIG. 5 and FIG. 6, in step S11, the connection direction of the ribbons 10 is a length direction of the ribbons 10. It may be understood that, along the length direction of the ribbons 10, each ribbon 10 is connected to the two adjacent back contact cells 20. The plurality of back contact cells 20 are successively arranged along the length direction of the ribbons 10.

Further, one cell string 100 comprises 2-20 back contact cells 20, for example, 2, 3, 4, 5, 10, 15, or 20 back contact cells.

Further, in this embodiment, referring to FIG. 4 and FIG. 6, the cell string 100 comprises 4 back contact cells 20. The 4 back contact cells 20 are successively arranged along the length direction of the ribbons 10.

Specifically, in step S11, the expression "electrodes corresponding to two adjacent back contact cells 20 have opposite polarities" means that busbars corresponding to the two adjacent back contact cells 20 have opposite polarities. It is to be noted that, the ribbons 10 are soldered to the busbars of the back contact cells 20.

In the method for soldering a solar cell in this embodiment of this disclosure, precisions of soldering between center lines of the ribbons 10 and center points of the busbars of the back contact cells 20 reach ±0.2 mm. That is to say, in the cell string 100 soldered by using the method for soldering a solar cell in this embodiment of this disclosure, offsets of the center lines of the ribbons 10 from the center points of the busbars of the back contact cells 20 are less than 0.2 mm.

Further, referring to FIG. 4, the electrode of each back contact cell 20 comprises a plurality of first busbars and a plurality of second busbars. The first busbars and the second busbars have opposite polarities. The plurality of first busbars and the plurality of second busbars are alternately arranged along a width direction of the ribbons 10. That is to say, in the width direction of the ribbons 10, one second busbar is arranged between two adjacent first busbars, and one first busbar is arranged between two adjacent second busbars. Each first busbar is provided with a plurality of first solder joints 21 successively arranged along an extending direction of the first busbar. Each second busbar is provided with a plurality of second solder joints 22 successively arranged along an extending direction of the second busbar.

It may be understood that, one ribbon 10 is connected to a column of first solder joints 21 of one of the two adjacent back contact cells 20 to a column of second solder joints 22 of the other of the two adjacent back contact cells 20. In this way, the ribbon 10 is connected to a first busbar of one of the two adjacent back contact cells 20 to a second busbar of the other of the two adjacent back contact cells 20.

Further, a quantity of the first solder joints 21 provided on each first busbar is an even number, and a quantity of the second solder joints 22 provided on the second busbar is also an even number.

Specifically, in an example in FIG. 4, the back surface of each back contact cell 20 is provided with 10 busbars, that is, 5 positive busbars and 5 negative busbars. It may be understood that, in other embodiments, a quantity of the busbars may be other values.

Specifically, insulation members may be arranged on two sides of each busbar on the back surface of the back contact cell 20. In this way, the ribbons 10 can be prevented from coming into contact with an electrode having an opposite polarity and thereby forming a short circuit. Further, the insulation members may be strip-shaped, and are parallel to the busbars. Further, insulation adhesives may be printed on two sides of the busbar on the back surface of the back contact cell 20, and are dried to be cured into the insulation members. In this way, the insulation adhesives are arranged more precisely.

Specifically, conductive members may be arranged on the busbars on the back surface of the back contact cell 20. The conductive members may be melted by means of heating. The conductive members are, for example, solder pastes. By means of the solder pastes, soldering between the busbars and the ribbons 10 is realized.

Specifically, in step S14, the ribbons 10 may be flat ribbons 10.

It may be understood that, in other embodiments, the ribbons 10 may be round ribbons 10.

Specifically, in step S14, all of the ribbons 10 may be simultaneously placed on the electrodes of the corresponding back contact cells 20. Therefore, the ribbons 10 may be placed at one time. During the placement, the ribbons 10 are always fixed by the first clamping portion 31, the second clamping portion 32, and the third clamping portions 33, so that high-precision alignment of the ribbons 10 to the back contact cells 20 is ensured.

It may be understood that, in other embodiments, all of the ribbons 10 may alternatively be successively placed one by one, or successively placed in batches. A specific manner of placing the plurality of to-be-connected ribbons on the electrodes of the plurality of back contact cells is not limited herein.

Specifically, referring to FIG. 5 and FIG. 6, in step S14, the ribbons 10 comprise a plurality of first ribbons 11 and a plurality of second ribbons 12. The first clamping portion 31 comprises a plurality of first clamping jaws 311 and a plurality of second clamping jaws 312. The first clamping jaws 311 and the second clamping jaws 312 are in staggered arrangement. The first clamping jaws 311 are configured to clamp head ends of the first ribbons 11, and the second clamping jaws 312 are configured to clamp head ends of the second ribbons 12. The second clamping portion 32 comprises a plurality of third clamping jaws 321 and a plurality of fourth clamping jaws 322. The third clamping jaws 321 and the fourth clamping jaws 322 are in staggered arrangement. The third clamping jaws 321 are configured to clamp tail ends of the first ribbons 11, and the fourth clamping jaws 322 are configured to clamp tail ends of the second ribbons 12.

Further, the plurality of first ribbons 11 and the plurality of second ribbons 12 are in staggered arrangement in the width direction of the ribbon 10. That is to say, in the width direction of the ribbon 10, one second ribbon 12 is arranged between two adjacent first ribbons 11, and one first ribbon 11 is arranged between two adjacent second ribbons 12. In this way, the first ribbons 11 and the second ribbons 12 respectively correspond to the first busbars and the second busbars of the back contact cells 20, thereby preventing dislocation.

Further, the first clamping jaws 311 and the second clamping jaws 312 are in staggered arrangement in the width direction of the ribbons 10. That is to say, in the width direction of the ribbon 10, one second clamping jaw 312 is arranged between two adjacent first clamping jaws 311, and one first clamping jaw 311 is arranged between two adjacent second clamping jaws 312. In this way, the first clamping jaws 311 and the second clamping jaws 312 respectively correspond to the first ribbons 11 and the second ribbons 12, thereby preventing dislocation.

Further, the first clamping jaws 311 and the second clamping jaws 312 are flush with each other in a thickness direction of the ribbons 10. In this way, the first clamping jaws 311 and the second clamping jaws 312 can be synchronously lifted and clamped, thereby improving clamping efficiency.

Further, the head ends of the first ribbons 11 and the second ribbons 12 are in staggered arrangement in the length direction of the ribbons 10, thereby facilitating soldering of the ribbons to the busbars.

Further, the first clamping jaws 311 and the second clamping jaws 312 are in staggered arrangement in the length direction of the ribbons 10. Since the head ends of the first ribbons 11 and the second ribbons 12 are in staggered arrangement in the length direction of the ribbons 10, it is ensured that the first clamping jaws 311 and the second clamping jaws 312 clamp the head ends of the corresponding ribbons 10. In addition, a space may be provided for the first clamping jaws 311 and the second clamping jaws 312, to prevent the first clamping jaws 311 and the second clamping jaws 312 prevented from interfering with each other during the synchronous lifting and clamping.

It is to be noted that, the plurality of third clamping jaws 321 and the plurality of fourth clamping jaws 322 of the second clamping portion 32 are similar to the plurality of first clamping jaws 311 and the plurality of second clamping jaws 312 of the first clamping portion 31. For explanation and description thereof, refer to the above. In order to avoid redundancy, details are not described herein again.

Specifically, referring to FIG. 5 and FIG. 6, in step S14, the third clamping portions 33 corresponds to the middle portions of the plurality of ribbons 10. Therefore, the middle portions of the plurality of ribbons 10 can be clamped. In this way, collapse of the middle portions caused by clamping of only the head ends and the tail ends of the ribbons 10 can be prevented, thereby preventing the ribbons 10 from breaking during clamping or transfer. In addition, a degree of freedom of the middle portions of the ribbons 10 in the width direction of the ribbons 10 is reduced, thereby facilitating improvement of the positioning precision and the soldering precision of the ribbons 10.

Specifically, in step S17, the plurality of ribbons 10 may be heated by means of at least one of infrared heating, electromagnetic heating, hot air heating, or laser heating, to connect the ribbons 10 to the plurality of back contact cells 20. In other words, the heater 104 may operate based on at least one of principles such as the infrared heating, the electromagnetic heating, the hot air heating, or the laser heating.

Further, in this embodiment, the heater 104 comprises an infrared light box. An infrared soldering lamp tube is arranged in the infrared light box. In step S17, the infrared light box is pressed toward the ribbons 10 and the back contact cells 20 by a preset distance to heat the ribbons 10, so as to solder the ribbons 10 to the back contact cells 20.

It may be understood that, in other embodiments, the heater 104 may be an electromagnetic heater 104, an air heater, or a laser heater 104.

Preferably, step S14 comprises: simultaneously placing the plurality of to-be-connected ribbons 10 on the electrodes of the plurality of back contact cells 20. Step S17 comprises: simultaneously heat the plurality of ribbons 10 by using the heater 104 to simultaneously connect the plurality of ribbons 10 to the plurality of back contact cells 20.

By simultaneously placing and soldering the plurality of ribbons 10, the soldering efficiency can be improved. In addition, during the placement, relative positions of the plurality of ribbons 10 are fixed, so that the high-precision alignment of the ribbons 10 to the back contact cells 20 is ensured.

More preferably, all of the ribbons 10 required for the entire cell string 100 are simultaneously placed on the electrodes of the plurality of back contact cells 20. All of the ribbons 10 required for the entire cell string 100 are simultaneously heated by using the heater 104, to simultaneously connect all of the ribbons 10 required for the entire cell string 100 to all of the back contact cells 20.

In this way, all of the ribbons 10 required for the entire cell string 100 can be simultaneously placed and soldered, thereby improving the soldering efficiency. In addition, during the placement, relative positions of all of the ribbons 10 required for the entire cell string 100 are fixed, so that the high-precision alignment of the ribbons 10 to the back contact cells 20 is ensured.

It may be understood that, in step S11, the plurality of back contact cells 20 may alternatively be simultaneously placed on the soldering platform 102. By simultaneously placing the back contact cells 20, the soldering efficiency can be improved.

Further, all of the back contact cells 20 required for the entire cell string 100 may be simultaneously placed on the soldering platform 102. By simultaneously placing all of the back contact cells 20 required for the entire cell string 100, the soldering efficiency can be further improved.

Referring to FIG. 6, optionally, a gap is formed each between two adjacent back contact cells 20, a plurality of third clamping portions 33 are arranged, and each third clamping portion 33 corresponds to one gap. In this way, the corresponding cut ribbons 10 can be clamped at the gaps. Therefore, even if the ribbons 10 are cut at the gaps, the ribbons do not drop from the third clamping portions 33, thereby preventing repeated clamping of the ribbons 10 and facilitating improvement of the production efficiency. In addition, even if the ribbons 10 are cut at the gaps, the ribbons do not displace at the third clamping portions 33, thereby ensuring the positioning accuracy of the ribbons 10.

Specifically, referring to FIG. 6, the third clamping portions 33 corresponding to two adjacent gaps respectively clamp the first ribbon 11 and the second ribbon 12. In this way, portions clamped by the third clamping portions 33 correspond to portions of the ribbons 10 required to be cut, thereby facilitating positioning for cutting of the ribbons 10 and improvement of the production efficiency. In addition, it can be ensured that the corresponding ribbons 10 cut at the gaps are clamped by the third clamping portions 33, thereby preventing the cut ribbons 10 from falling off or displacing.

In an example in FIG. 6, in a direction from the first clamping portion 31 to the second clamping portion 32, 3 gaps, namely, a first gap, a second gap, and a third gap are formed among 4 back contact cells 20. The third clamping portions 33 corresponding to the first gap clamp the second ribbons 12 cut at the first gap. The third clamping portions 33 corresponding to the second gap clamp the first ribbons 11 cut at the second gap. The third clamping portions 33 corresponding to the third gap clamp the second ribbons 12 cut at the third gap.

It may be understood that, in other embodiments, the third clamping portions 33 may clamp the first ribbons 11 and the second ribbons 12. Even if the ribbons 10 do not need to be cut at the gaps, the third clamping portions 33 still clamp the ribbons. In this way, the ribbons 10 that do not need to be cut at the gaps are prevented from collapsing as a result of an excessively large length, thereby preventing the ribbons 10 from breaking. In addition, a degree of freedom of the ribbons 10 that do not need to be cut at the gaps in the width direction of the ribbons 10 is reduced, thereby facilitating improvement of the positioning precision and the soldering precision of the ribbons 10.

Referring to FIG. 6, optionally, a distance S1 between the two adjacent third clamping portions 33 is greater than a width w of the back contact cell 20.

It is to be noted that, the distance S1 between the two adjacent third clamping portions 33 is a distance between center points of the two adjacent third clamping portions 33 in the length direction of the ribbons 10.

Therefore, in a case that each third clamping portion 33 corresponds to one gap, it is ensured that the distance S1 between the two adjacent third clamping portions 33 is large enough, so that it is ensured a range of the back contact cell 20 covered by the third clamping portion 33 is relatively small. In this way, the third clamping portion 33 can be prevented from interfering with the soldering between the ribbon 10 and the back contact cell 20. In addition, a space may be reserved for placing pressing tools 40 in FIG. 11 and FIG. 12 below, so as to avoid interference between the third clamping portions 33 and the pressing tools 40. It may be understood that, the first clamping portion 31, the second clamping portion 32, and the third clamping portions 33 may be removed from the back contact cells 20 after the pressing tools 40 are placed and before soldering is performed.

Specifically, the distance S1 between the two adjacent third clamping portions 33 equals a sum of the width w of the back contact cell 20 and a width d of the gap.

Therefore, the distance S1 between the two adjacent third clamping portions 33 is constant, so that a length of the ribbon 10 between the two adjacent third clamping portions 33 is constant. In this way, the positioning of the ribbons 10 at an interval of a predetermined length is realized, thereby improving the soldering precision.

Specifically, projections of centers of the third clamping portions 33 on the soldering platform 102 are located on projections of center lines of the gaps on the soldering platform 102. Therefore, the third clamping portions 33 can be precisely positioned through the gaps, thereby precisely positioning the ribbons 10. In addition, the third clamping portions 33 can be caused to be located at the centers of the gaps, so that the third clamping portions 33 cover the back contact cells 20 on two sides by similar ranges, and the third clamping portions 33 can be prevented from covering back contact cells 20 on one sides by a larger range. In this way, the third clamping portions 33 can be prevented from interfering with the soldering between the ribbons 10 and the back contact cells 20 on the sides.

Referring to FIG. 6, optionally, a distance s2 between the first clamping portion 31 and the adjacent third clamping portions 33 are greater than the width w of the back contact cell 20.

It is to be noted that, the distance s2 between the first clamping portion 31 and the adjacent third clamping portions 33 is a distance between center points of the clamping jaws of the first clamping portion 31 away from the third clamping portions 33 and the center points of the third clamping portions 33 in the length direction of the ribbons 10.

For example, in an example in FIG. 6, the clamping jaws of the first clamping portion 31 away from the third clamping portions 33 are the second clamping jaws 312. In this case, the distance s2 between the first clamping portion 31 and the adjacent third clamping portions 33 is a distance between center points of the second clamping jaws 312 and the center points of the third clamping portions 33 in the length direction of the ribbons 10.

Therefore, in a case that each third clamping portion 33 corresponds to one gap, it is ensured that the distance s2 between the first clamping portion 31 and the adjacent third clamping portions 33 is large enough, so that it is ensured that a range of the back contact cell 20 exposed between the first clamping portion 31 and the third clamping portions 33 is relatively large. In this way, the first clamping portion 31 and the third clamping portions 33 can be prevented from interfering with the soldering between the ribbons 10 and the back contact cell 20. In addition, a space may be reserved for placing pressing tools 40 in FIG. 11 and FIG. 12 below, so as to avoid interference between the third clamping portions 33 and the pressing tools 40. It may be understood that, the first clamping portion 31, the second clamping portion 32, and the third clamping portions 33 may be removed from the back contact cells 20 after the pressing tools 40 are placed and before soldering is performed.

Specifically, the distance s2 between the first clamping portion 31 and the adjacent third clamping portions 33 equal the sum of the width w of the back contact cell 20 and the width d of the gap.

Therefore, the distance s2 between the first clamping portion 31 and the adjacent third clamping portions 33 is constant, so that lengths of the ribbons 10 between the first clamping portion 31 and the adjacent third clamping portions 33 are constant. In this way, the positioning of the ribbons 10 at an interval of a predetermined length is realized, thereby improving the soldering precision.

Specifically, the projections of the centers of the third clamping portions 33 on the soldering platform 102 are located on the projections of the center lines of the gaps on the soldering platform 102, and a projection of a center of the first clamping portion 31 on the soldering platform 102 is located outside projections of the back contact cells 20 on the soldering platform 102.

Therefore, the third clamping portions 33 adjacent to the first clamping portion 31 can be precisely positioned through the gaps, thereby precisely positioning the ribbons 10. In addition, the third clamping portions 33 can be caused to be located at the centers of the gaps, so that the third clamping portions 33 cover the back contact cells 20 on two sides by similar ranges, and the third clamping portions 33 can be prevented from covering back contact cells 20 on one sides by a larger range. In this way, the third clamping portions 33 can be prevented from interfering with the soldering between the ribbons 10 and the back contact cells 20 on the sides. In addition, a smaller portion of the back contact cells 20 or no portion of the back contact cell is covered by the first clamping portion 31, so that the first clamping portion 31 is prevented from interfering with the soldering between the ribbon 10 and the back contact cells 20.

Referring to FIG. 6, optionally, a distance s3 between the second clamping portion 32 and the adjacent third clamping portions 33 is greater than the width w of the back contact cell 20. Specifically, the distance s3 between the second clamping portion 32 and the adjacent third clamping portions 33 equals the sum of the width w of the back contact cell 20 and the width d of the gap.

It is to be noted that, the distance s3 between the second clamping portion 32 and the adjacent third clamping portions 33 is similar to the distance s2 between the first clamping portion 31 and the adjacent third clamping portions 33. For explanation and description thereof, refer to the above. In order to avoid redundancy, details are not described herein again.

Figure 7:
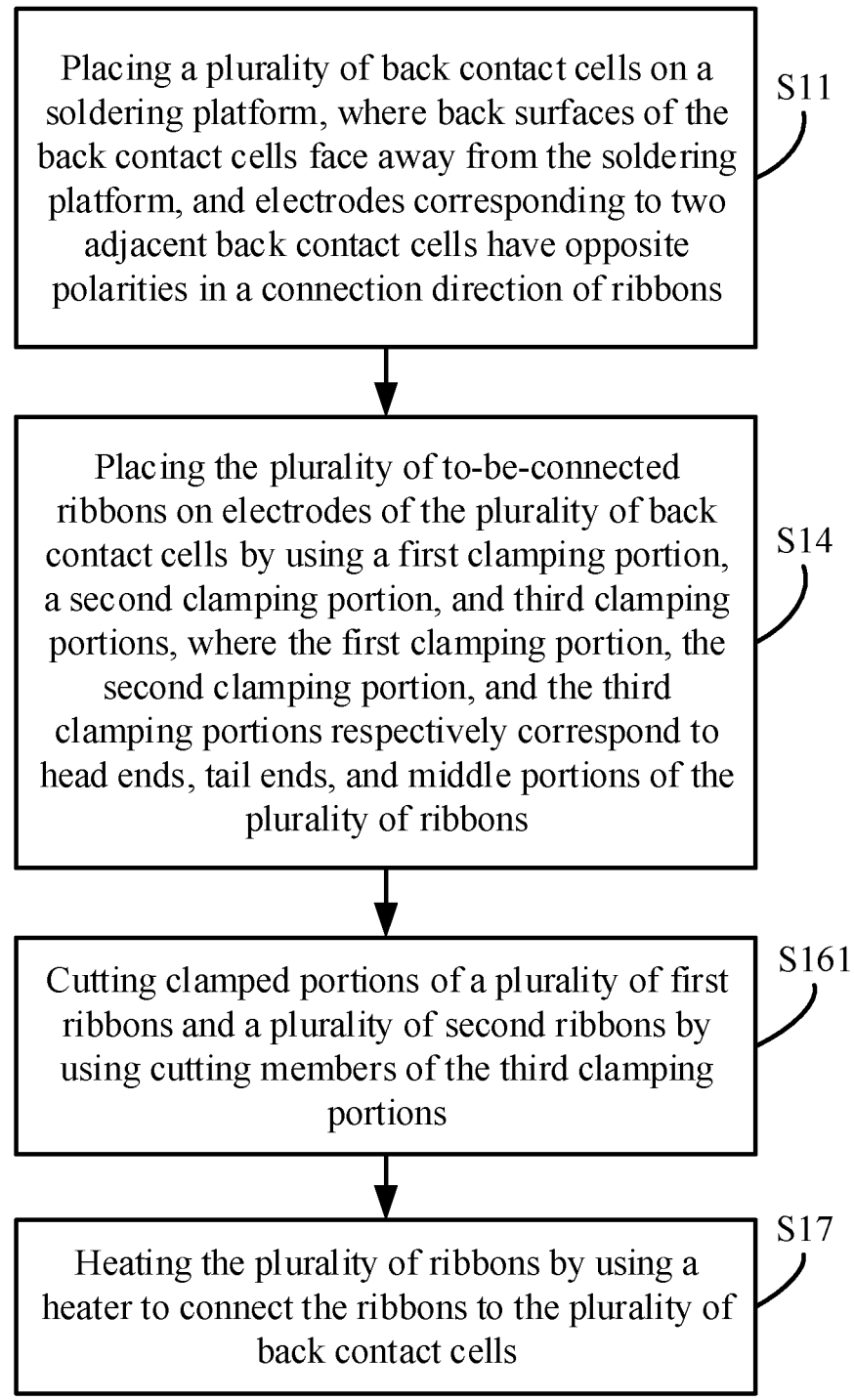
FIG. 7 is a schematic flowchart of a method for soldering a solar cell according to an embodiment of this disclosure.
Figure 8:
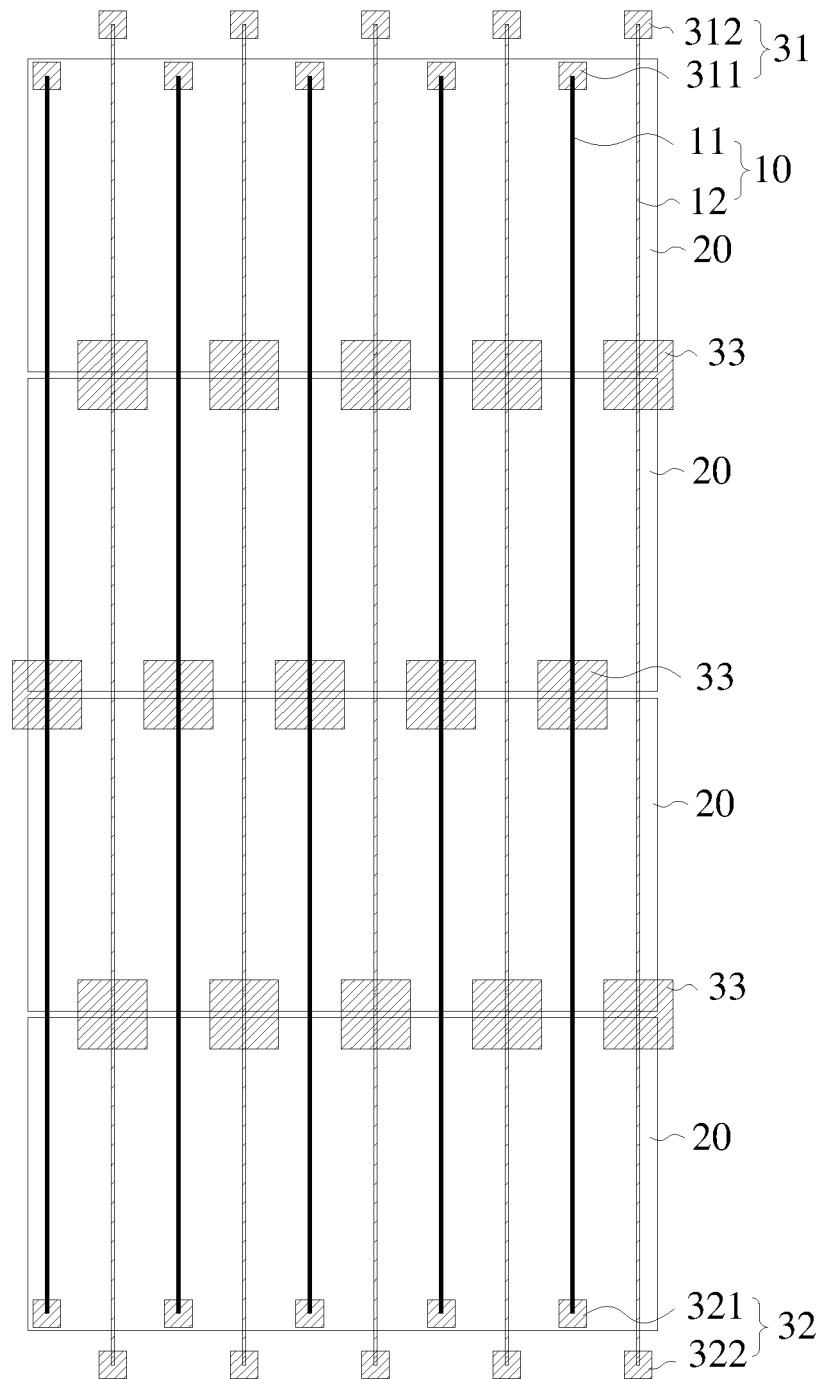
FIG. 8 is a schematic diagram of a scenario of the method for soldering a solar cell according to an embodiment of this disclosure.

Referring to FIG. 6, FIG. 7 and FIG. 8, optionally, the ribbons 10 comprise a plurality of first ribbons 11 and a plurality of second ribbons 12. One of the two adjacent third clamping portions 33 is configured to clamp one of the first ribbons 11, and the other of the two adjacent third clamping portions 33 is configured to clamp one of the second ribbons 12. Before step S17, the method for soldering a solar cell further comprises the following steps:

Step S161: Cutting clamped portions of the plurality of first ribbons 11 and the plurality of second ribbons 12 by using cutting members of the third clamping portions 33.

Therefore, the first ribbons 11 and the second ribbons 12 are respectively clamped, and the clamped portions of the ribbons 10 are cut. The cutting can be performed more precisely by positioning through clamping.

It may be understood that, FIG. 8 and FIG. 6 show states of the ribbons 10 before and after cutting.

Specifically, the first ribbons 11 and the second ribbons 12 may be cut simultaneously. Alternatively, the first ribbons 11 may be first cut, and then the second ribbons 12 are cut. Alternatively, the second ribbons 12 may be first cut, and then the first ribbons 11 are cut. Alternatively, the first ribbons 11 and the second ribbons 12 may be cut alternately.

Specifically, the plurality of first ribbons 11 may be cut simultaneously, may be successively cut one by one, or may be successively cut in batches. Likewise, the plurality of second ribbons 12 may be cut simultaneously, may be successively cut one by one, or may be successively cut in batches.

Preferably, step S161 comprises: simultaneously cutting the clamped portions of the plurality of first ribbons 11 and the plurality of second ribbons 12 by using the cutting members of the third clamping portions 33. By simultaneously cutting the ribbons 10, the soldering efficiency can be improved.

More preferably, the clamped portions of all of the first ribbons 11 and all of the second ribbons 12 required for the entire cell string 100 may be simultaneously cut by using the cutting members of the third clamping portions 33.

Therefore, the ribbons 10 may be cut at one time, thereby improving the soldering efficiency. In addition, during the cutting, the ribbons 10 are always fixed by the first clamping portion 31, the second clamping portion 32, and the third clamping portions 33, so that high-precision alignment of the ribbons 10 to the back contact cells 20 is ensured.

Specifically, in an example in FIG. 7, step S161 is between step S14 and step S17. In other words, after the plurality of to-be-connected ribbons 10 are placed on the electrodes of the plurality of the back contact cells 20, the clamped portions of the plurality of first ribbons 11 and the plurality of second ribbons 12 are cut, and then the plurality of cut ribbons 10 are soldered to the plurality of the back contact cells 20.

It may be understood that, in other embodiments, before step S14, that is, before the plurality of to-be-connected ribbons 10 are placed on the electrodes of the plurality of the back contact cells 20, the method for soldering a solar cell may further comprise: grabbing the plurality of ribbons 10 by using the first clamping portion 31, the second clamping portion 32, and the third clamping portions 33. After the plurality of ribbons 10 are grabbed by using the first clamping portion 31, the second clamping portion 32, and the third clamping portions 33, the clamped portions of the plurality of first ribbons 11 and the plurality of second ribbons 12 may be cut, and then the plurality of cut ribbons 10 to be connected are placed on the electrodes of the plurality of the back contact cells 20. Since the plurality of ribbons 10 have been grabbed and fixed during the cutting and therefore do not displace due to the cutting, the positioning precision of the ribbons 10 can be improved, thereby facilitating improvement of the soldering precision. In addition, since the ribbons 10 are cut before being placed on the back contact cells 20, adverse effects on the back contact cells 20 during the cutting can be avoided.

Further, the plurality of ribbons 10 may be grabbed by using the first clamping portion 31, the second clamping portion 32, and the third clamping portions 33 before step S11, that is, before the plurality of back contact cells 20 are placed on the soldering platform 102. Alternatively, the plurality of ribbons 10 may be grabbed by using the first clamping portion 31, the second clamping portion 32, and the third clamping portions 33 during step S11. The plurality of ribbons 10 may alternatively be grabbed by using the first clamping portion 31, the second clamping portion 32, and the third clamping portions 33 after step S11. A specific execution sequence is not limited herein.

It may be understood that, in other embodiments, during the grabbing of the plurality of ribbons 10 by using the first clamping portion 31, the second clamping portion 32, and the third clamping portions 33, the clamped portions of the plurality of first ribbons 11 and the plurality of second ribbons 12 may be cut, and then the plurality of cut ribbons 10 to be connected are placed on the electrodes of the plurality of the back contact cells 20. In this way, a time interval between the grabbing and the cutting can be reduced, thereby improving the production efficiency.

Specifically, the clamped portions are portions of the ribbons 10 clamped by the third clamping portions 33. Intersections of projections of the third clamping portions 33 on the soldering platform 102 and projections of the ribbons 10 on the soldering platform 102 are projections of the clamped portions on the soldering platform 102.

Specifically, the cutting members may be punching members. In other words, the clamped portions of the plurality of first ribbons 11 and the plurality of second ribbons 12 may be punched by using the punching members of the third clamping portions 33. Cutting planes formed by punching are smooth and vertical, and cuts are more aesthetically pleasing. It may be understood that, in other embodiments, each cutting member may be a device having a cutting function, such as scissors, a blade, or a laser cutter.

Specifically, a section of the ribbon 10 in the clamped portion of the ribbon 10 may be cut by using the cutting member. Therefore, a space is formed between two cuts of the cut ribbon 10, thereby avoiding a short circuit.

Further, a ratio of a length of the cut section of the ribbon 10 to a length of the clamped portion is 0.5. Therefore, a distance between the two cuts of the cut ribbon 10 is constant, so that the cell string 100 is more aesthetically pleasing. In addition, the distance between the two cuts of the cut ribbon 10 is quantized to further avoid the short circuit.

It may be understood that, in other embodiments, the ratio of the length of the cut section of the ribbon 10 to the length of the clamped portion may be 0.2, 0.25, 0.4, 0.6, or other values. This is not limited herein.

Further, a projection of a connecting line between the two cuts of the cut ribbon 10 on the soldering platform 102 intersects a projection of the gap on the soldering platform 102. In this way, it is ensured that the ribbon 10 corresponding to the gap is cut, so that the cut ribbon 10 can be prevented from spanning the gap and coming into contact with the back contact cell 20 on an other side of the gap, thereby preventing adverse effects on the back contact cell 20 on the other side of the gap.

Further, a projection of a center point of the distance between the two cuts of the cut ribbon 10 on the soldering platform 102 is located on the projection of the center line of the gap on the soldering platform 102. Therefore, distances from the two cuts of the cut ribbon 10 to the gap are the same, so that the cell string 100 is more aesthetically pleasing. In addition, the cutting member can be conveniently positioned during the cutting, thereby improving the soldering efficiency.

Figure 9:
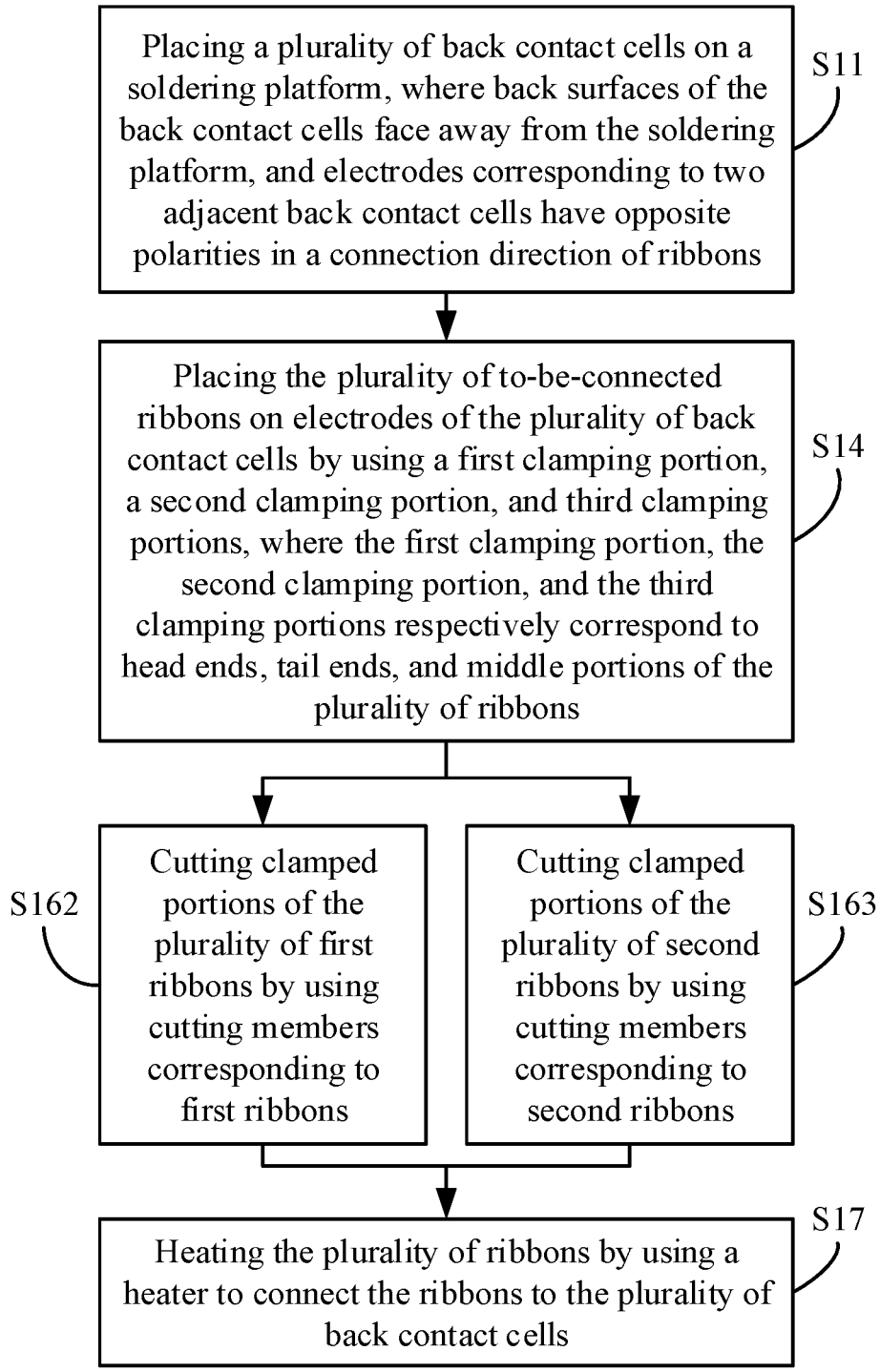
FIG. 9 is a schematic flowchart of a method for soldering a solar cell according to an embodiment of this disclosure.
Figure 10:
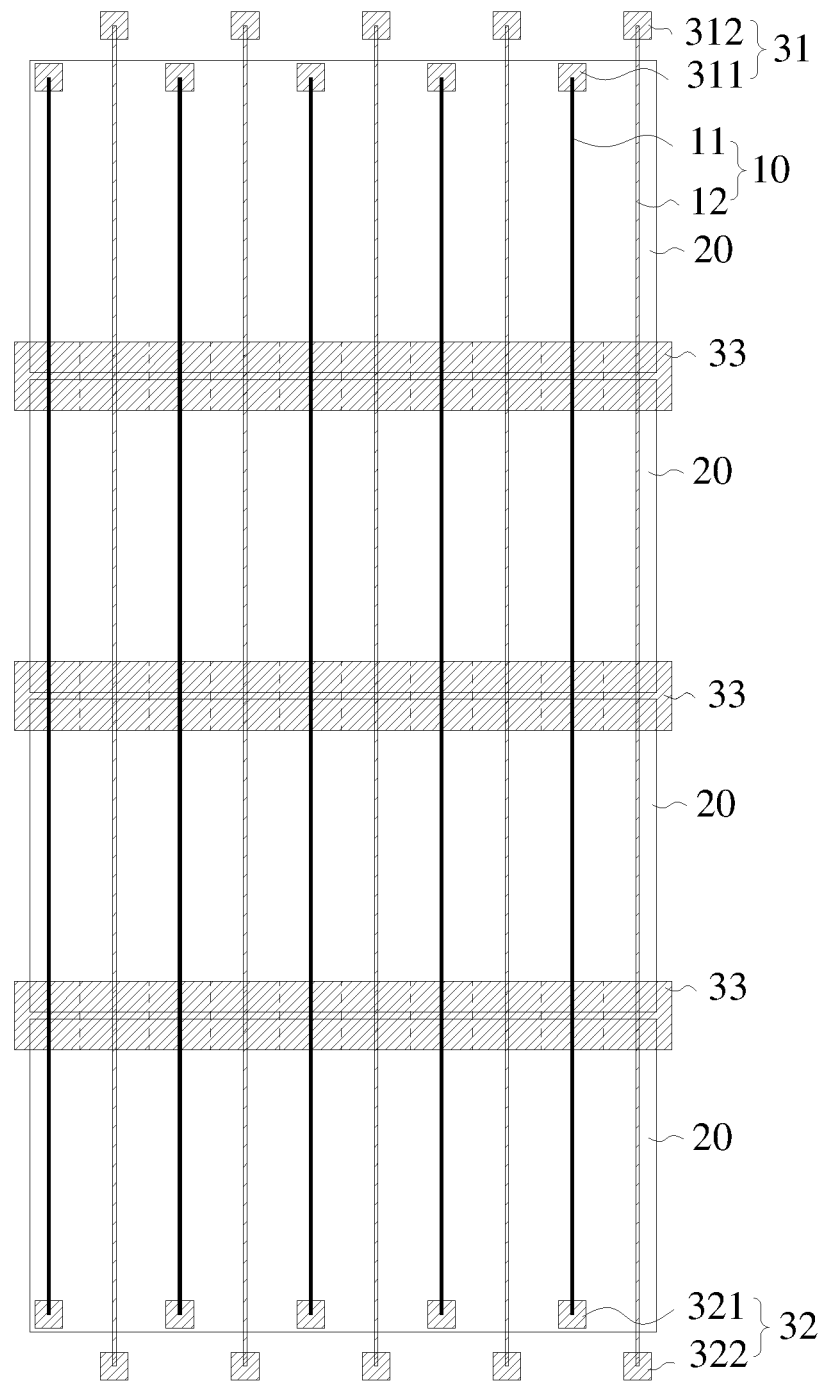
FIG. 10 is a schematic diagram of a scenario of the method for soldering a solar cell according to an embodiment of this disclosure.

Referring to FIG. 6, FIG. 9 and FIG. 10, optionally, the ribbons 10 comprise a plurality of first ribbons 11 and a plurality of second ribbons 12. The third clamping portions 33 are configured to clamp the first ribbons 11 and the second ribbons 12. The third clamping portions 33 comprise cutting members. The cutting members of the two adjacent third clamping portions 33 respectively correspond to the first ribbons 11 and the second ribbons 12. Before step S17, the method for soldering a solar cell further comprises the following steps:

Step S162: Cutting clamped portions of the plurality of first ribbons 11 by using the cutting members corresponding to the first ribbons 11.

Step S163: Cutting clamped portions of the plurality of second ribbons 12 by using the cutting members corresponding to the second ribbons 12.

The first ribbons 11 and the second ribbons 12 are clamped simultaneously, and the clamped portions of the ribbons 10 are selectively cut, so that a quantity of the clamped portions of the ribbons 10 can be increased, and lengths of portions of the ribbons 10 that are not clamped can be reduced, thereby preventing the portions that are not clamped from collapsing and easily breaking. In addition, a degree of freedom of the portions of the ribbons 10 that are not clamped in the width direction of the ribbons 10 is reduced, thereby facilitating improvement of the positioning precision and the soldering precision of the ribbons 10.

It may be understood that, FIG. 10 and FIG. 6 show states of the ribbons 10 before and after cutting.

Specifically, step S162 and step S163 may be performed simultaneously. In other words, the clamped portions of the second ribbons 12 may be cut by using the cutting members corresponding to the second ribbons 12 during the cutting of the clamped portions of the plurality of first ribbons 11 by using the cutting members corresponding to the first ribbons 11. In this way, a cutting time can be shortened, thereby improving the soldering efficiency.

It may be understood that, alternatively, the clamped portions of the plurality of first ribbons 11 may be first cut by using the cutting members corresponding to the first ribbons 11, and then the clamped portions of the plurality of second ribbons 12 may be cut by using the cutting members corresponding to the second ribbons 12. Alternatively, the clamped portions of the plurality of second ribbons 12 may be first cut by using the cutting members corresponding to the second ribbons 12, and then the clamped portions of the plurality of first ribbons 11 may be cut by using the cutting members corresponding to the first ribbons 11. Alternatively, the clamped portions of some of the first ribbons 11 may be cut by using the cutting members corresponding to the first ribbons 11 and the clamped portions of some of the second ribbons 12 may be cut by using the cutting members corresponding to the second ribbons 12, alternately.

Specifically, the plurality of first ribbons 11 may be cut simultaneously, may be successively cut one by one, or may be successively cut in batches. Likewise, the plurality of second ribbons 12 may be cut simultaneously, may be successively cut one by one, or may be successively cut in batches.

Specifically, in an example in FIG. 9, step S162 and step S163 are between step S14 and step S17. In other words, after the plurality of to-be-connected ribbons 10 are placed on the electrodes of the plurality of the back contact cells 20, the clamped portions of the plurality of first ribbons 11 are cut by using the cutting members corresponding to the first ribbons 11, the clamped portions of the plurality of second ribbons 12 are cut by using the cutting members corresponding to the second ribbons 12, and then the plurality of cut ribbons 10 are soldered to the plurality of the back contact cells 20.

It may be understood that, in other embodiments, before step S14, that is, before the plurality of to-be-connected ribbons 10 are placed on the electrodes of the plurality of the back contact cells 20, the method for soldering a solar cell may further comprise: grabbing the plurality of ribbons 10 by using the first clamping portion 31, the second clamping portion 32, and the third clamping portions 33. After the plurality of ribbons 10 are grabbed by using the first clamping portion 31, the second clamping portion 32, and the third clamping portions 33, the clamped portions of the plurality of first ribbons 11 are cut by using the cutting members corresponding to the first ribbons 11, the clamped portions of the plurality of second ribbons 12 are cut by using the cutting members corresponding to the second ribbons 12, and then the plurality of cut ribbons 10 to be connected are placed on the electrodes of the plurality of the back contact cells 20. Since the plurality of ribbons 10 have been grabbed and fixed during the cutting and therefore do not displace due to the cutting, the positioning precision of the ribbons 10 can be improved, thereby facilitating improvement of the soldering precision.

It may be understood that, in other embodiments, during the grabbing of the plurality of ribbons 10 by using the first clamping portion 31, the second clamping portion 32, and the third clamping portions 33, the clamped portions of the plurality of first ribbons 11 are cut by using the cutting members corresponding to the first ribbons 11, the clamped portions of the plurality of second ribbons 12 are cut by using the cutting members corresponding to the second ribbons 12, and then the plurality of cut ribbons 10 to be connected are placed on the electrodes of the plurality of the back contact cells 20. In this way, a time interval between the grabbing and the cutting can be reduced, thereby improving the production efficiency.

Specifically, the clamped portions are portions of the ribbons 10 clamped by the third clamping portions 33. It may be understood that, since the third clamping portions 33 clamp the first ribbons 11 and the second ribbons 12, in FIG. 10, the projections of the third clamping portions 33 on the soldering platform 102 intersect projections of the first ribbons 11 and the second ribbons 12 on the soldering platform 102. In FIG. 10, cut areas are separated from areas that are not cut by dashed lines in FIG. 10, and correspond to areas in FIG. 6 covered by the third clamping portions 33. That is to say, regardless of the example in FIG. 8 or the example in FIG. 10, the areas in FIG. 6 covered by the third clamping portions 33 are the cut areas.

Preferably, step S162 comprises: simultaneously cutting the clamped portions of the plurality of first ribbons 11 by using the cutting members corresponding to the first ribbons 11. Step S163 comprises: simultaneously cutting the clamped portions of the plurality of second ribbons 12 by using the cutting members corresponding to the second ribbons 12. By simultaneously cutting the ribbons 10, the soldering efficiency can be improved.

More preferably, the clamped portions of all of the first ribbons 11 required for the entire cell string 100 may be simultaneously cut by using the cutting members corresponding to the first ribbons 11. The clamped portions of all of the second ribbons 12 required for the entire cell string 100 may be simultaneously cut by using the cutting members corresponding to the second ribbons 12.

Therefore, the ribbons 10 may be cut simultaneously at one time, thereby improving the soldering efficiency. In addition, during the cutting, the ribbons 10 are always fixed by the first clamping portion 31, the second clamping portion 32, and the third clamping portions 33, so that high-precision alignment of the ribbons 10 to the back contact cells 20 is ensured.

Figure 11:
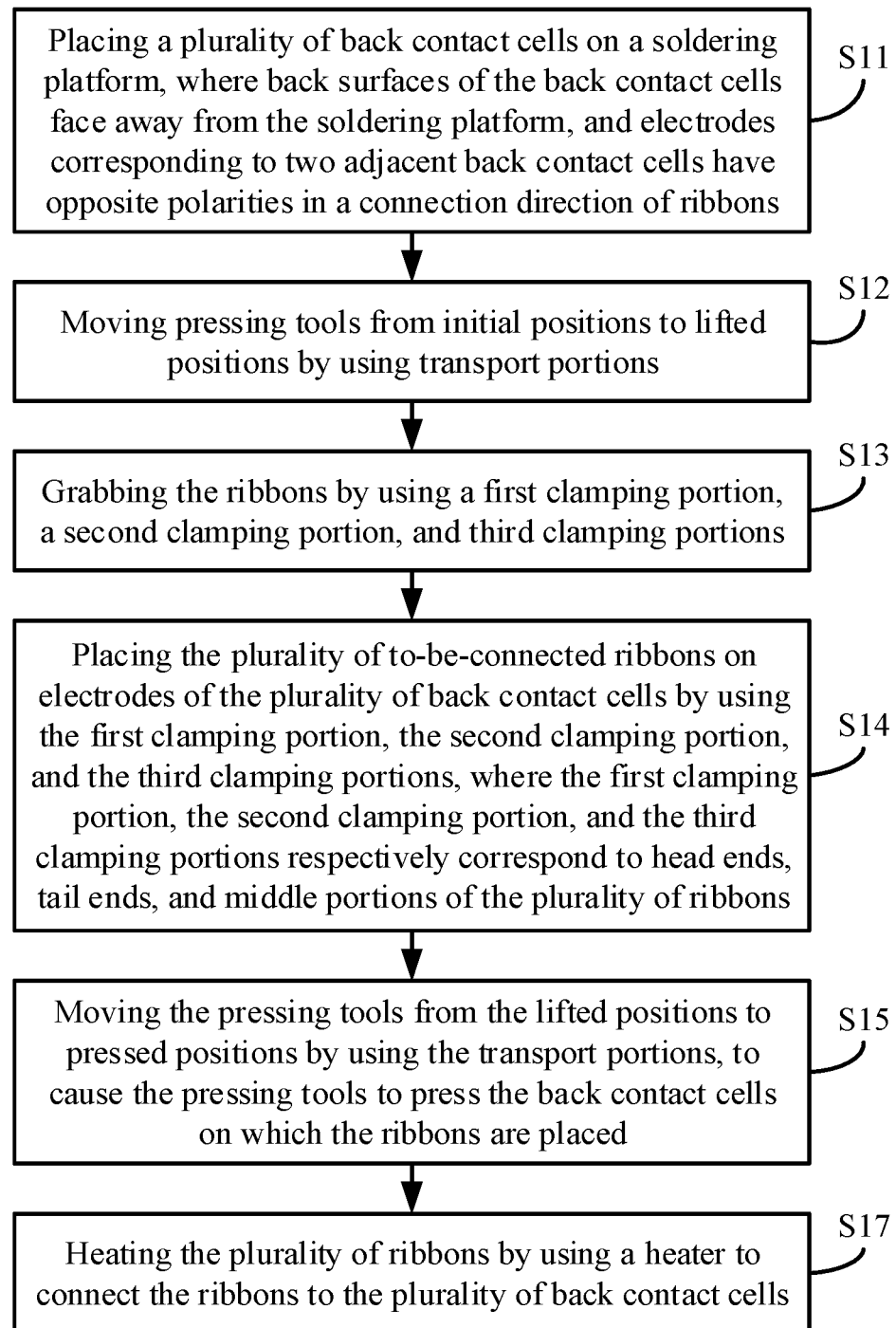
FIG. 11 is a schematic flowchart of a method for soldering a solar cell according to an embodiment of this disclosure.
Figure 12:
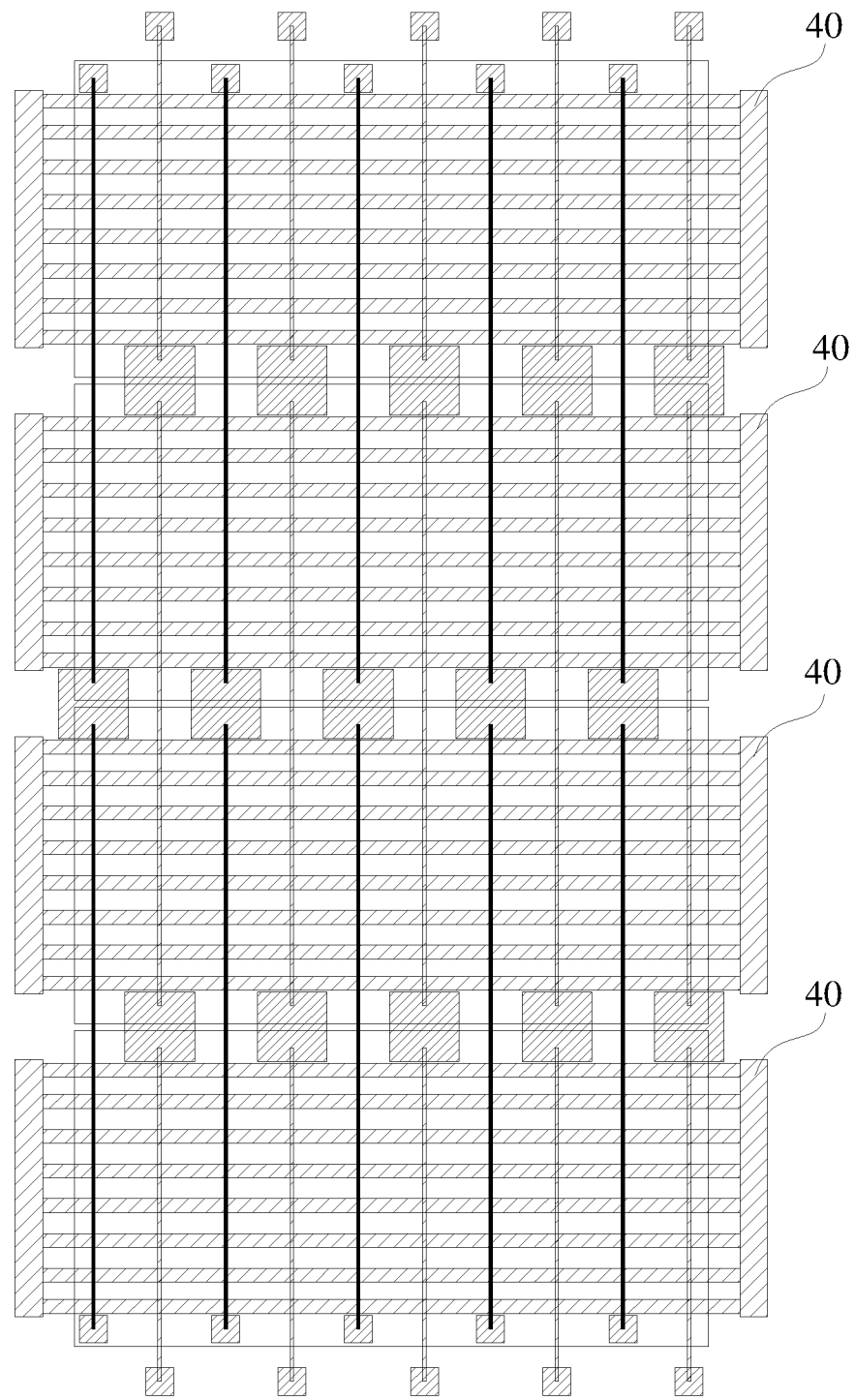
FIG. 12 is a schematic diagram of a scenario of the method for soldering a solar cell according to an embodiment of this disclosure.

Referring to FIG. 11 and FIG. 12, optionally, transport portions are arranged among the first clamping portion 31, the second clamping portion 32, and the third clamping portions 33. Before step S14, the method for soldering a solar cell further comprises the following steps:

Step S12: Moving a plurality of pressing tools 40 from initial positions to lifted positions by using the transport portions.

Step S13: Grabbing the plurality of ribbons 10 by using the first clamping portion 31, the second clamping portion 32, and the third clamping portions 33.

After step S14, the method for soldering a solar cell further comprises the following step:

Step S15: Moving the plurality of pressing tools 40 from the lifted positions to pressed positions by using the transport portions, to cause the pressing tools 40 to press the back contact cells 20 on which the ribbons 10 are placed.

By lifting the pressing tools 40 before the ribbons 10 are grabbed, the pressing tools 40 can be prevented from interfering with the grabbing of the ribbons 10. In addition, after the plurality of ribbons 10 are placed on the electrodes of the plurality of back contact cells 20, the pressing tools 40 are pressed, so that the plurality of back contact cells 20 and the plurality of ribbons 10 can be simultaneously pressed. Therefore, the plurality of back contact cells 20 and the plurality of ribbons 10 do not move during the soldering, thereby improving the soldering precision.

Specifically, the initial positions are positions of the pressing tools 40 before contact with the transport portions. The initial positions may be located on a conveyor. After the pressing tools 40 are used, the transport portions may place the pressing tools 40 on the conveyor to return to the initial positions for use next time.

Specifically, the lifted positions are positions higher than the initial positions. That is to say, the transport portions lift the plurality of pressing tools 40 from the initial positions. When the pressing tools 40 are at the lifted positions, the grabbing of the ribbons 10 by the first clamping portion 31, the second clamping portion 32, and the third clamping portions 33 is not interfered, and the back contact cells 20 on which the ribbons 10 are placed can be conveniently pressed after the ribbons 10 are placed on the back contact cells 20.

Specifically, the pressed positions are positions where the pressing tools 40 press the back contact cells 20 on which the ribbons 10 are placed.

Specifically, each of the transport portions comprises a sucker and/or a clamping member. Further, the sucker comprises a vacuum sucker and/or a magnetic sucker. Therefore, various implementation forms of the transport portions are provided. The implementation form may be selected according to actual production requirements, thereby helping adapt to various production scenarios.

Specifically, the expression "transport portions are arranged among the first clamping portion 31, the second clamping portion 32, and the third clamping portions 33" means as follows: In the length direction of the ribbons 10, the transport portion is arranged between the first clamping portion 31 and the third clamping portions 33 adjacent to the first clamping portion 31, and is configured to transport the pressing tools 40 between the first clamping portion 31 and the third clamping portions 33 adjacent to the first clamping portion 31; the transport portion is arranged between the second clamping portion 32 and the third clamping portions 33 adjacent to the second clamping portion 32 and is configured to transport the pressing tools 40 between the second clamping portion 32 and the third clamping portions 33 adjacent to the second clamping portion 32; and the transport portion is arranged between the two adjacent third clamping portions 33, and is configured to transport the pressing tool 40 between the two adjacent third clamping portions 33.

In other words, in the length direction of the ribbons 10, the pressing tool 40, namely, a first pressing tool is arranged between the first clamping portion 31 and the third clamping portions 33 adjacent to the first clamping portion 31; the pressing tool 40, namely, a second pressing tool is arranged between the second clamping portion 32 and the third clamping portions 33 adjacent to the second clamping portion 32; and. the pressing tool 40, namely, a third pressing tool is arranged between the two adjacent third clamping portions 33.

It may be understood that, at least two pressing tools 40 of the first pressing tools, the second pressing tools, and the plurality of third pressing tools may be connected to form one pressing tool 40. The pressing tool 40 may be transported at one time, thereby facilitating improvement of precision of positioning the pressing tools 40.

Further, the first pressing tools, the second pressing tools, and the plurality of third pressing tools are connected to form an entire pressing tool 40. In this way, the efficiency and the precision of positioning the pressing tools 40 can be maximized.

It may be understood that, in other embodiments, in the length direction of the ribbons 10, the pressing tools 40 may be arranged in one or more of the following three areas. A first area is an area between the first clamping portion 31 and the third clamping portions 33 adjacent to the first clamping portion 31. A second area is an area between the second clamping portion 32 and the third clamping portions 33 adjacent to the second clamping portion 32. A third area is an area between the two adjacent third clamping portions 33.

Specifically, in step S12, each pressing tool 40 may be provided with a plurality of pressing needles. Each pressing needle corresponds to one solder joint of the back contact cell 20. By means of the pressing needles, the intensity of pressure of a soldering area can be increased, so that a soldering effect is more desirable.

Further, surfaces of the pressing needles may be covered with alumina layers. By means of the alumina layers, insulation can be achieved. Further, the pressing needles may be aluminum needles. Therefore, the surfaces of the pressing needles may be covered with the alumina layers through oxidation.

Specifically, in step S12, a quantity of cross beams of the pressing tool 40 may be same as a quantity of the solder joints of each busbar of the back contact cell 20.

Specifically, the pressing tool 40 comprises a plurality of cross beams. An extending direction of each cross beam is perpendicular to a length direction of the ribbons 10. In this way, the pressing tool 40 can press the ribbon 10 and the back contact cell 20 more effectively, thereby facilitating improvement of the soldering precision.

Further, in a case that the pressing tool 40 press the back contact cell 20 on which the ribbon 10 is placed, the solder joints of the back contact cell 20 are exposed from a gap between two adjacent cross beams. In this way, convenient soldering can be achieved, and the pressing tool 40 can be prevented from interfering with the soldering.

Specifically, in step S13, one ribbon 10, a plurality of ribbons 10, a section of the ribbon 10, or a plurality of sections of the ribbons 10 may be grabbed by using the first clamping portion 31, the second clamping portion 32, and the third clamping portions 33.

In this embodiment, all of the ribbons 10 are grabbed by using the first clamping portion 31, the second clamping portion 32, and the third clamping portions 33. Therefore, the ribbons 10 can be clamped and transferred at one time. During the placement, the ribbons 10 are always fixed by the first clamping portion 31, the second clamping portion 32, and the third clamping portions 33, so that high-precision alignment of the ribbons 10 to the back contact cells 20 is ensured.

It may be understood that, in other embodiments, the ribbons 10 may be successively grabbed one by one or successively grabbed in batches.

Preferably, step S12 comprises: simultaneously moving the plurality of pressing tools 40 from the initial positions to the lifted positions by using the transport portions. Step S13 comprises: simultaneously grabbing the plurality of ribbons 10 by using the first clamping portion 31, the second clamping portion 32, and the third clamping portions 33. Step S15 comprises: simultaneously moving the plurality of pressing tools 40 from the lifted positions to the pressed positions by using the transport portions, to cause the pressing tools 40 to simultaneously press the back contact cells 20 on which the ribbons 10 are placed.

By simultaneously grabbing and placing the plurality of pressing tools 40 and simultaneously grabbing the plurality of ribbons 10, the soldering efficiency can be improved. In addition, during the placement of the pressing tools 40, all of the ribbons 10 required for the entire cell string 100 are always clamped by the first clamping portion 31, the second clamping portion 32, and the third clamping portions 33, so that relative positions are fixed, thereby ensuring the high-precision alignment of the ribbons 10 to the back contact cells 20.

More preferably, all of the pressing tools 40 required for the entire cell string 100 may be simultaneously moved from the initial positions to the lifted positions by using the transport portions. All of the ribbons 10 required for the entire cell string 100 are simultaneously grabbed by using the first clamping portion 31, the second clamping portion 32, and the third clamping portions 33. All of the pressing tools 40 required for the entire cell string 100 are simultaneously moved from the lifted positions to the pressed positions by using the transport portions, to cause all of the pressing tools 40 required for the entire cell string 100 to simultaneously press the back contact cells 20 on which the ribbons 10 are placed.

In this way, all of the pressing tools 40 required for the entire cell string 100 can be simultaneously grabbed and placed, and the ribbons required for the entire cell string 100 can be simultaneously grabbed, thereby improving the soldering efficiency. In addition, during the placement of the pressing tools 40, all of the ribbons 10 required for the entire cell string 100 are always clamped by the first clamping portion 31, the second clamping portion 32, and the third clamping portions 33, so that relative positions are fixed, thereby ensuring the high-precision alignment of the ribbons 10 to the back contact cells 20.

Optionally, the head ends of all of the ribbons 10 required for the entire cell string 100 may be grabbed by using the first clamping portion 31. The first clamping portion 31 IS moved to pull out the ribbons 10 from a ribbon coil. After all of the ribbons 10 are pulled out by a preset distance, the second clamping portion 32 clamps the tail ends of all of the ribbons 10 and cut the tail ends of all of the ribbons 10 to separate the tail ends from the ribbon coil. During the pulling out of the ribbons 10 from the ribbon coil by the first clamping portion 31, the third clamping portions 33 may correspondingly clamp the ribbons 10. Therefore, the ribbons 10 can be fabricated at one time. During the fabrication of the ribbons 10, the ribbons 10 are successively fixed by the first clamping portion 31, the second clamping portion 33, and the third clamping portions 32, so that high-precision alignment of the ribbons 10 to the back contact cells 20 is ensured.

It may be understood that, in other embodiments, the ribbons 10 may be successively fabricated one by one or successively fabricated in batches.

To sum up, according to the method for soldering a solar cell in this embodiment of this disclosure, the ribbons 10 can be fabricated, grabbed, clamped, and placed at one time, and the pressing tools 40 can be grabbed, placed, and soldered at one time. During the fabrication, grabbing, clamping, and placement of the ribbons 10, the ribbons 10 are always fixed by the first clamping portion 31, the second clamping portion 32, and the third clamping portions 33, so that high-precision alignment of the ribbons 10 to the back contact cells 20 is ensured.

Figure 3:
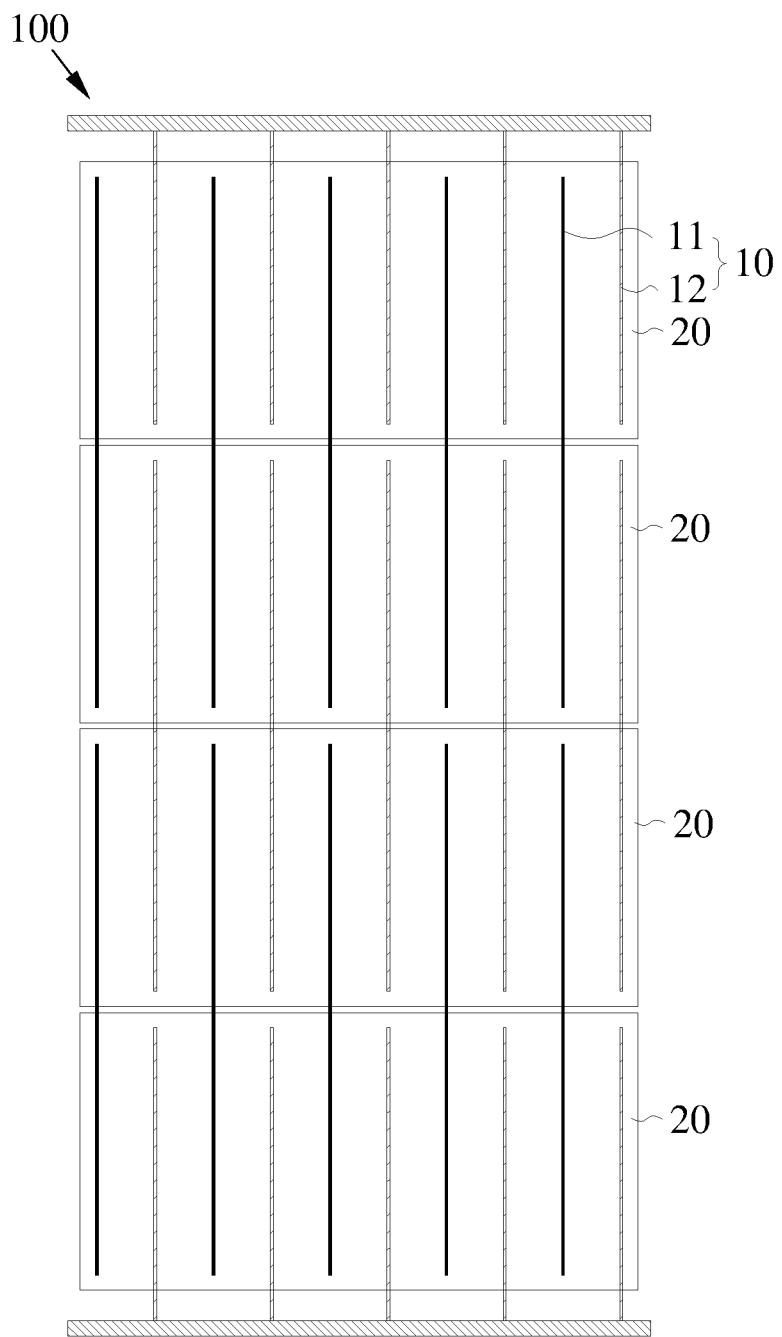
FIG. 3 is a schematic structural diagram of a cell string soldered by the method for soldering a solar cell according to an embodiment of this disclosure.

Referring to FIG. 3, a cell string 100 in an embodiment of this disclosure is soldered by using any of the above methods for soldering a solar cell.

A photovoltaic module in an embodiment of this disclosure comprises the above cell string 100.

According to the cell string 100 and the photovoltaic module in the embodiments of this disclosure, the back surfaces of the back contact cells 20 face upward during soldering, and the plurality of ribbons 10 are simultaneously clamped, transferred, and soldered. Therefore, soldering precision and production efficiency can be improved, and production costs can be reduced. In addition, since the soldering precision is improved, a finger having an opposite polarity can be designed closer to a busbar without resulting in a short circuit. In this way, the finger can collect currents of more areas, thereby facilitating improvement of cell efficiency and module efficiency.

For explanation and description of the cell string 100 and the photovoltaic module, refer to the above. In order to avoid redundancy, details are not described herein again.

Figure 2:
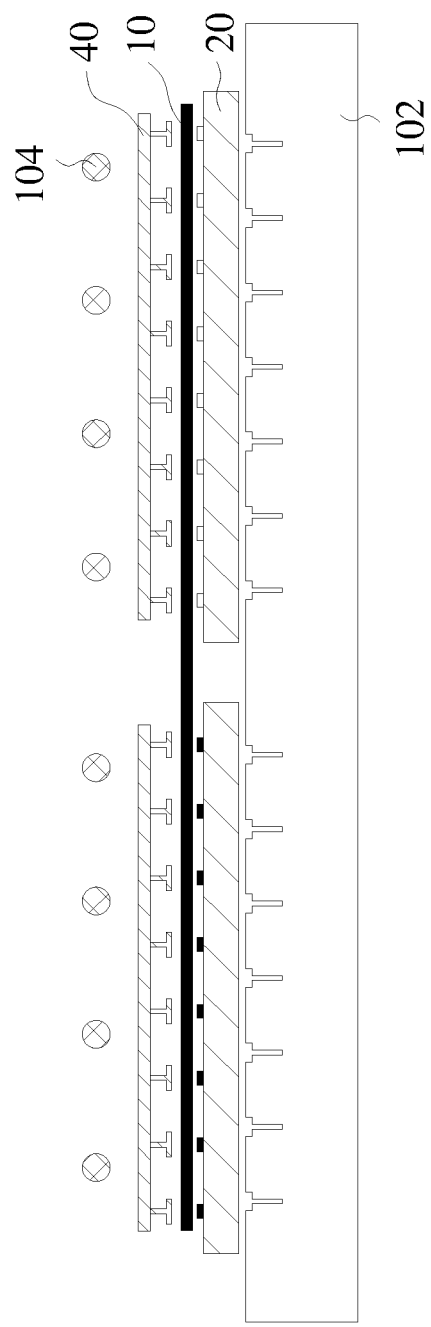
FIG. 2 is a schematic diagram of a scenario of the method for soldering a solar cell according to an embodiment of this disclosure.

Referring to FIG. 2 and FIG. 6, a soldering device in an embodiment of this disclosure comprises a soldering platform 102, a first clamping portion 31, a second clamping portion 32, third clamping portions 33, and a heater 104. The soldering platform 102 is configured to carry a plurality of back contact cells 20, and back surfaces of the back contact cells 20 face away from the soldering platform 102. Electrodes corresponding to two adjacent back contact cells 20 have opposite polarities in a connection direction of ribbons 10. The first clamping portion 31, the second clamping portion 32, and the third clamping portions 33 respectively correspond to head ends, tail ends, and middle portions of the plurality of ribbons 10, and are configured to place a plurality of to-be-connected ribbons 10 on the electrodes of the plurality of back contact cells 20 in the connection direction of the ribbons 10. The heater 104 is configured to heat the plurality of ribbons 10 to connect the plurality of ribbons 10 to the plurality of back contact cells 20.

According to the soldering device in this embodiment of this disclosure, the back surfaces of the back contact cells 20 face upward during soldering, and the plurality of ribbons 10 are simultaneously clamped, transferred, and soldered. Therefore, soldering precision and production efficiency can be improved, and production costs can be reduced. In addition, since the soldering precision is improved, a finger having an opposite polarity can be designed closer to a busbar without resulting in a short circuit. In this way, the finger can collect currents of more areas, thereby facilitating improvement of cell efficiency and module efficiency.

For explanation and description of the soldering device, refer to the above. In order to avoid redundancy, details are not described herein again.

Preferably, the first clamping portion 31, the second clamping portion 32, and the third clamping portions 33 are configured to simultaneously place the plurality of to-be-connected ribbons 10 on the electrodes of the plurality of back contact cells 20. The heater 104 is configured to simultaneously heat the plurality of ribbons 10 to simultaneously connect the plurality of ribbons 10 to the plurality of back contact cells 20.

More preferably, the first clamping portion 31, the second clamping portion 32, and the third clamping portions 33 are configured to simultaneously place all of the ribbons 10 required for an entire cell string 100 on the electrodes of the plurality of back contact cells 20. Simultaneously heating the plurality of ribbons 10 by using the heater 104 to simultaneously connect the plurality of ribbons 10 to the plurality of back contact cells 20 comprises: simultaneously heating, by the heater 104, all of the ribbons 10 required for the entire cell string 100, to simultaneously connect all of the ribbons 10 required for the entire cell string 100 to all of the back contact cells 20.

Optionally, the ribbons 10 comprise a plurality of first ribbons 11 and a plurality of second ribbons 12. The first clamping portion 31 comprises a plurality of first clamping jaws 311 and a plurality of second clamping jaws 312. The first clamping jaws 311 and the second clamping jaws 312 are in staggered arrangement. The first clamping jaws 311 are configured to clamp head ends of the first ribbons 11, and the second clamping jaws 312 are configured to clamp head ends of the second ribbons 12. The second clamping portion 32 comprises a plurality of third clamping jaws 321 and a plurality of fourth clamping jaws 322. The third clamping jaws 321 and the fourth clamping jaws 322 are in staggered arrangement. The third clamping jaws 321 are configured to clamp tail ends of the first ribbons 11, and the fourth clamping jaws 322 are configured to clamp tail ends of the second ribbons 12.

Optionally, a gap is formed between each two adjacent back contact cells 20, a plurality of third clamping portions 33 are arranged, and each third clamping portion 33 corresponds to one gap.

Optionally, a distance between two adjacent third clamping portions 33 is greater than a width of each of the back contact cells 20.

Optionally, the distance between two adjacent third clamping portions 33 equals a sum of the width of the back contact cell 20 and a width of the gap.

Optionally, a distance between the first clamping portion 31 and the adjacent third clamping portions 33 is greater than the width of the back contact cell 20.

Optionally, the distance between the first clamping portion 31 and the adjacent third clamping portions 33 equals the sum of the width of the back contact cell 20 and the width of the gap.

Optionally, a distance between the second clamping portion 32 and the adjacent third clamping portions 33 is greater than the width of the back contact cell 20.

Optionally, the distance between the second clamping portion 32 and the adjacent third clamping portions 33 equals the sum of the width of the back contact cell 20 and the width of the gap.

Optionally, the ribbons 10 comprise a plurality of first ribbons 11 and a plurality of second ribbons 12. One of the two adjacent third clamping portions 33 is configured to clamp one of the first ribbons 11, and the other of the two adjacent third clamping portions 33 is configured to clamp one of the second ribbons 12. The third clamping portions 33 comprise cutting members. The cutting members are configured to cut clamped portions of the plurality of first ribbons 11 and the plurality of second ribbons 12.

Preferably, the cutting members are configured to simultaneously cut the clamped portions of the plurality of first ribbons 11 and the plurality of second ribbons 12.

More preferably, the cutting members are configured to simultaneously cut the clamped portions of all of the first ribbons 11 and all of the second ribbons 12 required for the entire cell string 100.

Optionally, the ribbons 10 comprise a plurality of first ribbons 11 and a plurality of second ribbons 12. The third clamping portions 33 are configured to clamp the first ribbons 11 and the second ribbons 12. The third clamping portions 33 comprise cutting members. The cutting members of two adjacent third clamping portions 33 respectively correspond to one of the first ribbon 11 and one of the second ribbon 12. The cutting members corresponding to the first ribbons 11 are configured to cut clamped portions of the plurality of first ribbons 11. The cutting members corresponding to the second ribbons 12 are configured to cut clamped portions of the plurality of second ribbons 12.

Preferably, the cutting members corresponding to the first ribbons 11 are configured to simultaneously cut the clamped portions of the plurality of first ribbons 11. The cutting members corresponding to the second ribbons 12 are configured to simultaneously cut clamped portions of the plurality of second ribbons 12.

More preferably, the cutting members corresponding to the first ribbons 11 are configured to simultaneously cut the clamped portions of all of the first ribbons 11 required for the entire cell string 100. The cutting members corresponding to the second ribbons 12 are configured to simultaneously cut the clamped portions of all of the second ribbons 12 required for the entire cell string 100.

Optionally, transport portions are arranged among the first clamping portion 31, the second clamping portion 32, and the third clamping portions 33, and are configured to move a plurality of pressing tools 40 from initial positions to lifted positions. The first clamping portion 31, the second clamping portion 32, and the third clamping portions 33 are configured to grab the ribbons 10. The transport portions are configured to move the plurality of pressing tools 40 from the lifted positions to pressed positions, to cause the pressing tools 40 to press the back contact cells 20 on which the ribbons 10 are placed.

Preferably, the transport portions are configured to simultaneously move the plurality of pressing tools 40 from the initial positions to the lifted positions. The first clamping portion 31, the second clamping portion 32, and the third clamping portions 33 are configured to simultaneously grab the plurality of ribbons 10. The transport portions are configured to simultaneously move the plurality of pressing tools 40 from the lifted positions to the pressed positions, to cause the pressing tools 40 to simultaneously press the back contact cells 20 on which the ribbons 10 are placed.

More preferably, the transport portions are configured to simultaneously move all of the pressing tools 40 required for the entire cell string 100 from the initial positions to the lifted positions. The first clamping portion 31, the second clamping portion 32, and the third clamping portions 33 are configured to simultaneously grab all of the ribbons 10 required for the entire cell string 100. The transport portions are configured to simultaneously move all of the pressing tools 40 required for the entire cell string 100 from the lifted positions to the pressed positions, to cause all of the pressing tools 40 required for the entire cell string 100 to simultaneously press the back contact cells 20 on which the ribbons 10 are placed.

The foregoing descriptions are merely exemplary embodiments of this application, but are not intended to limit this application. Any modification, equivalent replacement, or improvement and the like made within the spirit and principle of this application fall within the protection scope of this application.

What is claimed is:

1. A method for soldering a back contact solar cell string, comprising:
    placing a plurality of back contact cells on a soldering platform forming gaps between adjacent back contact cells, wherein
       the gaps comprise first gaps and second gaps that are disposed alternately with each other;
       back surfaces of the back contact cells face away from the soldering platform, and
       electrodes corresponding to two adjacent back contact cells have opposite polarities;
    placing a plurality of ribbons on the electrodes of the plurality of back contact cells by using a first clamping portion, a second clamping portion, and a plurality of third clamping portions comprising cutting members, wherein
       the first clamping portion, the second clamping portion, and the plurality of third clamping portions respectively correspond to head ends, tail ends, and middle portions of the plurality of ribbons, and
       the plurality of ribbons comprises first ribbons and second ribbons, and polarities of electrodes of one of the back contact solar cells corresponding to the first ribbons are opposite to polarities of electrodes of the one of the back contact solar cells corresponding to the second ribbons;
    grabbing and cutting the first ribbons at the first gaps and the second ribbons at the second gaps by using the plurality of third clamping portions; and
    heating the plurality of ribbons by using a heater to connect the plurality of ribbons to the plurality of back contact solar cells.

2. The method for soldering a back contact solar cell string of claim 1, wherein
    placing the plurality of ribbons on the electrodes of the plurality of back contact cells comprises simultaneously placing the plurality of ribbons on the electrodes of the plurality of back contact cells; and
    heating the plurality of ribbons by using a heater to connect the plurality of ribbons to the plurality of back contact cells comprises simultaneously heating the plurality of ribbons by using the heater to simultaneously connect the plurality of ribbons to the plurality of back contact cells.

3. The method for soldering a back contact solar cell string of claim 2, wherein
    simultaneously placing the plurality of ribbons on the electrodes of the plurality of back contact cells comprises simultaneously placing all of the ribbons required for an entire the cell string on the electrodes of the plurality of back contact cells; and
    simultaneously heating the plurality of ribbons by using the heater to simultaneously connect the plurality of ribbons to the plurality of back contact cells comprises simultaneously heating all of the ribbons required for the entire cell string by using the heater, to simultaneously connect all of the ribbons required for the entire cell string to all of the back contact cells.

4. The method for soldering a back contact solar cell string of claim 1, wherein
    the first clamping portion comprises a plurality of first clamping jaws and a plurality of second clamping jaws; the first clamping jaws and the second clamping jaws are in staggered arrangement; the first clamping jaws are configured to clamp head ends of the first ribbons; and the second clamping jaws are configured to clamp head ends of the second ribbons; and
    the second clamping portion comprises a plurality of third clamping jaws and a plurality of fourth clamping jaws; the third clamping jaws and the fourth clamping jaws are in staggered arrangement; the third clamping jaws are configured to clamp tail ends of the first ribbons; and the fourth clamping jaws are configured to clamp tail ends of the second ribbons.

5. The method for soldering a back contact solar cell string of claim 1, wherein each third clamping portion corresponds to one of the gaps.

6. The method for soldering a back contact solar cell string of claim 5, wherein a distance between two adjacent third clamping portions is greater than a width of each of the back contact cells.

7. The method for soldering a back contact solar cell string of claim 5, wherein a distance between the first clamping portion and adjacent third clamping portions is greater than a width of each of the back contact cells.

8. The method for soldering a back contact solar cell string of claim 5, wherein a distance between the second clamping portion and adjacent third clamping portions is greater than a width of each of the back contact cells.

9. The method for soldering a back contact solar cell string of claim 1, wherein transport portions are arranged among the first clamping portion, the second clamping portion, and the third clamping portions, and before placing the plurality of ribbons on the electrodes of the plurality of back contact cells by using the first clamping portion, the second clamping portion, and the third clamping portions, the method for soldering a back contact solar cell string further comprises:

moving a plurality of pressing tools from initial positions to lifted positions by using the transport portions; and grabbing the plurality of ribbons by using the first clamping portion, the second clamping portion, and the third clamping portions; and after placing the plurality of ribbons on the electrodes of the plurality of back contact cells by using the first clamping portion, the second clamping portion, and the third clamping portions, the method for soldering a back contact solar cell string further comprises:

moving the plurality of pressing tools from the lifted positions to pressed positions by using the transport portions, to cause the pressing tools to press the back contact cells on which the ribbons are placed.

10. The method for soldering a back contact solar cell string of claim 9, wherein moving a plurality of pressing tools from initial positions to lifted positions by using the transport portions comprises simultaneously moving the plurality of pressing tools from the initial positions to the lifted positions by using the transport portions;

grabbing the plurality of ribbons by using the first clamping portion, the second clamping portion, and the third clamping portions comprises simultaneously grabbing the plurality of ribbons by using the first clamping portion, the second clamping portion, and the third clamping portions; and moving the plurality of pressing tools from the lifted positions to pressed positions by using the transport portions, to cause the pressing tools to press the back contact cells on which the ribbons are placed comprises simultaneously moving the plurality of pressing tools from the lifted positions to the pressed positions by using the transport portions, to cause the pressing tools to simultaneously press the back contact cells on which the ribbons are placed.

11. The method for soldering a back contact solar cell string of claim 10, wherein simultaneously moving the plurality of pressing tools from the initial positions to the lifted positions by using the transport portions comprises simultaneously moving all of the pressing tools required for the entire cell string from the initial positions to the lifted positions by using the transport portions;

simultaneously grabbing the plurality of ribbons by using the first clamping portion, the second clamping portion, and the third clamping portions comprises simultaneously grab all of the ribbons required for the entire cell string by using the first clamping portion, the second clamping portion, and the third clamping portions; and simultaneously moving the plurality of pressing tools from the lifted positions to the pressed positions by using the transport portions, to cause the pressing tools to simultaneously press the back contact cells on which the ribbons are placed comprises simultaneously moving all of the pressing tools required for the entire cell string from the lifted positions to the pressed positions by using the transport portions, to cause all of the pressing tools required for the entire cell string to simultaneously press the back contact cells on which the ribbons are placed.

12. A cell string, soldered by using the method for soldering a back contact solar cell string of claim 1.

13. A photovoltaic module, comprising the cell string of claim 12.

* * * * *